United States Patent
Iyoki

(10) Patent No.: US 8,115,367 B2
(45) Date of Patent: Feb. 14, 2012

(54) PIEZOELECTRIC ACTUATOR PROVIDED WITH A DISPLACEMENT METER, PIEZOELECTRIC ELEMENT, AND POSITIONING DEVICE

(75) Inventor: Masato Iyoki, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 330 days.

(21) Appl. No.: 12/276,740

(22) Filed: Nov. 24, 2008

(65) Prior Publication Data

US 2009/0189485 A1 Jul. 30, 2009

(30) Foreign Application Priority Data

Nov. 26, 2007 (JP) ................ 2007-304798
Oct. 29, 2008 (JP) ................ 2008-278548

(51) Int. Cl.
*H01L 41/08* (2006.01)
*H01L 41/047* (2006.01)

(52) U.S. Cl. ........................ 310/369; 310/365
(58) Field of Classification Search ............... 310/365, 310/369

See application file for complete search history.

(56) References Cited

U.S. PATENT DOCUMENTS

| 7,231,802 B2 * | 6/2007 | Okada .............. 73/1.38 |
| 7,288,762 B2 * | 10/2007 | Iyoki et al. ........ 250/306 |
| 7,578,162 B2 * | 8/2009 | Okada .............. 73/1.38 |
| 2009/0206707 A1 * | 8/2009 | Iyoki .............. 310/369 |

FOREIGN PATENT DOCUMENTS

| JP | 03011898 A | * | 1/1991 |
| JP | 07249392 A | * | 9/1995 |
| JP | 9-89913 A | | 4/1997 |
| JP | 09089913 A | * | 4/1997 |
| JP | 11259133 A | * | 9/1999 |
| JP | 2000162219 A | * | 6/2000 |
| JP | 2003315239 A | * | 11/2003 |

* cited by examiner

*Primary Examiner* — Jaydi San Martin
(74) *Attorney, Agent, or Firm* — Brinks Hofer Gilson & Lione

(57) ABSTRACT

By resistor attached by a piezoelectric element, measurement with high accuracy is possible by strain of the piezoelectric element. A piezoelectric actuator includes the piezoelectric element which is formed into an arbitrary shape, polarized in an arbitrary direction, and includes electrodes provided on at least two surfaces opposed in a thickness direction thereof. The piezoelectric actuator also includes a driver power supply for applying a voltage between the electrodes to generate strain in the piezoelectric element, a driver power supply for applying a voltage to generate strain in the piezoelectric element, resistors provided on the electrodes through intermediation of insulators, and a displacement detection device connected with the resistors. The electrodes of the piezoelectric element on which the resistors are provided are set at a ground potential.

19 Claims, 35 Drawing Sheets

PIEZOELECTRIC ACTUATOR PROVIDED WITH A DISPLACEMENT METER, PIEZOELECTRIC ELEMENT, AND POSITIONING DEVICE

RELATED APPLICATIONS

This application claims priority under 35 U.S.C. §119 to Japanese Patent Application Nos. JP2007-304798 filed on Nov. 26, 2007, and JP2008-278548 filed on Oct. 29, 2008, the entire contents of which are hereby incorporated by reference.

BACKGROUND OF THE INVENTION

1. Field of the Invention

The present invention relates to a piezoelectric actuator used for, for example, a positioning device of a precision apparatus, and is applied to, for example, a scanner for a scanning probe microscope.

2. Description of the Related Art

Up to now, a piezoelectric actuator has been used for a precision positioning device with precision of the order of sub-nanometers to several hundred micrometers in various precision apparatuses including measurement apparatuses.

Hereinafter, the positioning device using the piezoelectric actuator is described by way of example of a scanning probe microscope (see JP 09-089913 A).

FIG. 22 is a structural diagram illustrating a conventional scanning probe microscope. The conventional scanning probe microscope includes a cantilever 214 having a probe 213 at the tip, a sample holder 211 which is opposed to the probe 213 and used to place a sample 212, a triaxial fine adjustment mechanism 215, and a displacement detection mechanism 219 for detecting bending of the cantilever 214. The triaxial fine adjustment mechanism 215 includes a lateral fine adjustment mechanism for moving the probe 213 in in-plane directions of the sample and a vertical fine adjustment mechanism for moving the probe 213 in a direction perpendicular to a surface of the sample.

In the conventional technique illustrated in FIG. 22, a piezoelectric actuator including a cylindrical piezoelectric element is used as the triaxial fine adjustment mechanism 215. The cylindrical piezoelectric element is polarized such that inner crystals are uniformly aligned in a direction orthogonal to the center axis of the cylinder between an inner surface and an outer surface of the cylindrical piezoelectric element. A single common electrode 232 is formed on the inner surface of the cylindrical piezoelectric element, and a band-shaped electrode portion 235 and four-part electrode portions 233 and 234 are formed on the outer surface thereof. The band-shaped electrode portion 235 is provided along the circumference of the cylindrical piezoelectric element. The four-part electrode portions 233 and 234 are obtained by dividing the cylindrical piezoelectric element into four around the circumference and provided in a direction parallel to the center axis. When the side on which the band-shaped electrode portion 235 is provided is assumed to be a tip end and the side on which the four-part electrode portions 233 and 234 are provided is assumed to be a terminal end, the cantilever 214 is attached to the tip end, and the terminal end is fixed to a base (not shown).

In the cylindrical piezoelectric actuator, the four-part electrode portions 233 and 234 serve as the lateral fine adjustment mechanism and the band-shaped electrode portion 235 serves as the vertical fine adjustment mechanism. When the cylindrical piezoelectric actuator is to be driven, the common electrode 232 formed on the inner surface is connected with a ground potential terminal, and voltages having reverse phases are applied to two electrodes which are opposed to each other about the center axis of the four-part electrode portions 233 and 234. At this time, one of the electrodes extends in the direction parallel to the center axis and the other electrode contracts. As a result, bending occurs in the cylindrical piezoelectric element, whereby the tip end performs arc motion. The amount of movement during the arc motion is considerably small, and hence the probe 213 can be moved substantially parallel to the in-plane of the sample 212. The other two electrodes opposed to each other are also operated in the same manner. Therefore, the probe 213 can be two-dimensionally moved within the in-plane of the sample 212.

When a voltage is applied to the band-shaped electrode portion 235 formed on the outer surface, strain occurs in the diameter direction. As a result, strain also occurs in the direction parallel to the center axis. Therefore, the probe 213 can be moved in a direction orthogonal to the sample 212.

An optical lever method is normally used for the displacement detection mechanism for the cantilever 214. The displacement detection mechanism 219 includes a semiconductor laser 216, a condenser lens 217, and a photo detector 218. Light from the semiconductor laser 216 is focused on a rear surface of the cantilever 214 by the condenser lens 217. The light reflected on the rear surface of the cantilever 214 is detected by the photo detector 218. When bending occurs in the cantilever 214, a position of a spot on the photo detector 218 changes. Therefore, when the amount of change is detected, the bending of the cantilever 214 can be detected.

When the probe 213 is brought close to the sample 212 in the scanning probe microscope having the structure described above, the cantilever 214 is bent by the action of the interatomic force or contact force. In this case, the amount of bending depends on a distance between the probe 213 and the sample 212. Therefore, the amount of bending is detected by the displacement detection mechanism 219 for the cantilever 214. The vertical fine adjustment mechanism is operated by a control circuit 221 such that the amount of bending becomes constant. While feedback control is performed such that the distance between the probe 213 and the sample 212 becomes constant, raster scanning is performed using the lateral fine adjustment mechanism by a scanning circuit 222. Thus, an unevenness image on the surface of the sample can be measured. In addition to the measurement method using the contact system for detecting the static bending of the cantilever 214, there is a measurement method using a vibration system, in which the distance between the probe 213 and the sample 212 is controlled based on the amount of change in amplitude, phase, or frequency which is caused by the action of the interatomic force or intermittent contact force while the cantilever 214 is vibrated at the vicinity of the resonance frequency.

The triaxial fine adjustment mechanism 215 used as the positioning device of the scanning probe microscope includes the piezoelectric element, and hence a hysteresis or creep occurs. The hysteresis is a phenomenon in which, when a voltage is applied to the piezoelectric element, a displacement corresponding to the voltage does not become completely linear but performs such behavior as approximated by a quadratic curve. The creep is a phenomenon in which, when a voltage is applied to the piezoelectric element, the displacement does not immediately reach the target amount of movement but gradually and finely changes with time.

When the hysteresis or creep occurs, it is difficult to perform accurate positioning. Therefore, there is a system for detecting a displacement of a positioning device by a displacement detection device for detecting the displacement of the piezoelectric element as a more precise positioning means, to compensate for hysteresis or creep.

Various systems such as an optical sensor, a capacitance sensor, and a magnetic sensor are used for the displacement detection device for detecting the displacement of the piezoelectric element. A detection method using a strain gauge is effective as a method which requires a minimum space and is low cost and convenient.

FIG. 23 illustrates the piezoelectric actuator provided with a displacement meter for detecting the displacement of the triaxial fine adjustment mechanism 215 of the scanning probe microscope by strain gauges according to the conventional technique. In the conventional technique, strain gauges 201a, 201b, 202a, and 202b are bonded to the respective electrodes of the four-part electrode portions 233 and 234 formed on the outer surface of the cylindrical piezoelectric element. Two strain gauges 203a and 203b are bonded to the band-shaped electrode portion 235 in parallel to the center axis. Each of the strain gauges is a normally available strain gauge, and is bonded in a direction in which large output is obtained when strain occurs in a direction parallel to the center axis of the cylindrical piezoelectric element. In the normal strain gauge, an insulating material such as a polyimide resin, paper, a phenol resin, an epoxy resin, or a phenol/epoxy-mixed resin is used for a base material. A metal material such as a copper-nickel alloy or a nichrome-based alloy or a resistor made of a semiconductor such as single-crystal silicon is provided on the base material and electrically connected with an external detection device through an electrode pattern which is formed on the base material and made of, for example, nickel.

A bridge circuit as illustrated in FIG. 24 is incorporated into the lateral fine adjustment mechanism. The bridge circuit includes a pair of strain gauges 201a and 201b or 202a and 202b bonded to two opposed electrodes 233 and 234 and two fixed resistors 241 and 242. A bridge voltage e0 is applied to the bridge circuit to measure an output voltage e1. When strain occurs in the piezoelectric element, resistance values of the strain gauges 201a, 201b, 202a, and 202b are changed to change a value of the output voltage e1. When the output voltage e1 is detected, the amount of strain of the piezoelectric element can be measured. In the conventional technique, the pair of strain gauges 201a and 201b and the pair of strain gauges 202a and 202b for the respective axes are each bonded to the electrodes 233 and 234 opposed about the center axis. Therefore, when the lateral fine adjustment mechanism is bent around the center axis, respective strain directions become reverse to each other, and hence signs of detection signals of the pair of strain gauges also become reverse to each other. Thus, an output voltage two times larger than in a case where a strain gauge is bonded to only a single electrode can be obtained, thereby increasing a signal strength with respect to noise. A variation in resistance value due to a temperature change is canceled as temperature compensation.

In the case of the vertical fine adjustment mechanism, a bridge circuit as illustrated in FIG. 25 is incorporated thereinto. The bridge circuit includes two strain gauges 203a and 203b and two fixed resistors 241 and 242. The bridge voltage e0 is applied to the bridge circuit to measure the output voltage e1. When strain occurs in the piezoelectric element, resistance values of the strain gauges are changed to change the value of the output voltage e1. When the output voltage e1 is detected, the amount of strain of the piezoelectric element can be measured. Even in this case, an output voltage two times larger than in the case of the single strain gauge can be obtained. Note that a variation in resistance value due to a temperature change is not canceled for compensation in the bridge circuit.

For the output of the strain gauge, the output voltage e1 and the displacement are calibrated based on data obtained when a calibration sample is measured by another displacement meter whose displacement is calibrated in advance or the scanning probe microscope using the triaxial fine adjustment mechanism 215. Therefore, the amount of displacement can be measured from the obtained output voltage e1.

As described above, the feedback control is performed based on the displacement information obtained from the output voltage of the strain gauges continuously, to linearly operate the triaxial fine adjustment mechanism according to an applied voltage. The scanning probe microscope is not necessarily linearly operated in the vertical direction according to the voltage. There is also a case where height information obtained from the output signal of the strain gauges is displayed without any processing.

However, in the conventional piezoelectric actuator having the structure as described above, the strain gauges are directly bonded through intermediation of an insulator to surfaces of the electrodes which are applied with the drive voltage for the piezoelectric element. Therefore, the insulator is sandwiched by the surface of the electrode of the piezoelectric element and the resistor of the strain gauge or a resistor connection electrode connected with the resistor. The base material serves as a dielectric, and hence the strain gauge bonding portions act like capacitors, thereby generating a capacitance component. Thus, the detection signal of the strain gauges cannot be accurately measured because of the influence of the capacitance component.

A high voltage for driving the piezoelectric element is applied between the surfaces of the electrodes of the piezoelectric element. Therefore, a lead wire connected with the strain gauge may be brought in contact with an electrode associated with the piezoelectric element, or the electrode or the resistor of the strain gauge may be connected with the electrode of the piezoelectric element through an inner portion of the base material of the strain gauge because of a deterioration with time. Then, the high voltage is applied to the strain gauge or the displacement detection device connected with the strain gauge, with the result that the strain gauge or the displacement detection device may be broken. In addition, when an insulation resistance of the base material is low, there is a case where the detection signal of the strain gauge cannot be accurately measured because of a leak current.

SUMMARY OF THE INVENTION

Therefore, an object of the present invention is to provide a highly reliable piezoelectric actuator provided with a displacement meter, which can measure strain of a piezoelectric element with high precision by resistors attached to the piezoelectric element without being affected by a capacitance component or a leak current, and does not cause defects due to short circuit, the piezoelectric element used for the piezoelectric actuator, and a positioning device using the piezoelectric actuator.

In order to solve the problems described above, according to the present invention, the following means are provided.

According to one aspect of the present invention, a piezoelectric actuator provided with a displacement meter includes: a piezoelectric element which is formed into an arbitrary shape, has an internal crystal polarized in an arbitrary direction, and includes electrodes provided on at least two surfaces opposed in a thickness direction thereof; a driver power supply for applying a voltage between the electrodes to generate strain in the piezoelectric element; resistors provided on the electrodes through intermediation of insulators; and a displacement detection device connected with the resistors, for detecting a change in resistance value when an arbitrary voltage is applied between the resistors, to detect the amount of strain of the piezoelectric element. The electrodes of the piezoelectric element, on which the resistors are provided, are set at a ground potential.

Further, according to the present invention, the electrodes of the piezoelectric element, on which the resistors are provided, are set at a potential equal to the voltage applied between the resistors.

Further, according to another aspect of the present invention, a piezoelectric element used for a piezoelectric actuator provided with a displacement meter is formed into a cylindrical shape. Electrodes are provided on both an inner surface and an outer surface of the cylindrical piezoelectric element. A resistor is provided on the electrode provided on the outer surface, through intermediation of an insulator. In the cylindrical piezoelectric element, the electrode provided on the inner surface is divided into a plurality of parts. The electrode provided on the outer surface is a single band-shaped electrode provided along a circumference or a combination of a single band-shaped electrode and a folded electrode connected with the electrode provided on the inner surface. A resistor is provided on the band-shaped electrode located on the outer surface, through intermediation of an insulator.

Further, the cylindrical piezoelectric element includes at least two electrodes provided on the inner surface; a piezoelectric material; and an electrode which is opposed to the each of the at least two electrodes provided on the inner surface and provided on the outer surface; at least one of the at least two electrodes provided on the inner surface is a dummy electrode which causes no strain; each of remaining electrodes of the at least two electrodes provided on the inner surface is an active electrode which strains the piezoelectric element when the voltage is applied; at least one resistor is provided on an outer surface side of the active electrode; at least one resistor is provided on an outer surface side of the dummy electrode; the electrodes on which the resistors are provided are set to be equal in potential to each other and connected with ground; and when strain is to be detected by the resistor provided on the outer surface side of the active electrode, the resistors provided between the active electrode and the dummy electrode are connected to serve as a bridge circuit so that temperature compensation is performed by the resistor provided on the outer surface side of the dummy electrode.

Further, the piezoelectric element including the dummy electrode and the piezoelectric element including the active electrode are formed with an identical piezoelectric material and separated from each other.

In addition, in the cylindrical piezoelectric element, at least one of the electrode provided on the inner surface and the electrode provided on the outer surface is produced by a method including forming an electrode on a surface of a piezoelectric material and then removing a part of the electrode by mechanical processing.

Further, at least one of the electrode provided on the inner surface and the electrode provided on the outer surface is produced by a method including forming a mask on a region of a surface of a piezoelectric material, forming an electrode on a region other than the region on which the mask is formed, and removing the mask.

The piezoelectric element used for the piezoelectric actuator provided with a displacement meter according to the present invention has one of a bimorph type structure and a unimorph type structure in which a plate-shaped piezoelectric element is bonded to at least one of an upper surface and a lower surface of an arbitrary plate-shaped elastic member, electrodes are provided on respective surface sides of the piezoelectric element and interface sides between the piezoelectric element and the elastic member, and resistors are provided on the electrodes located on the surface sides of the piezoelectric element through intermediation of insulators.

Further, the piezoelectric element used for the piezoelectric actuator provided with a displacement meter according to the another aspect of the present invention is formed as a stacked piezoelectric element including a plurality of film-shaped piezoelectric elements and a plurality of electrodes alternately stacked, the electrodes are alternately connected with the plurality of electrodes each sandwiched by two of the plurality of film-shaped piezoelectric elements and formed as side surface electrodes of the stacked piezoelectric element, and one of the side surface electrodes includes a resistor provided through intermediation of an insulator.

According to the present invention, a piezoelectric actuator provided with a displacement meter includes: a piezoelectric element which is formed into an arbitrary shape, has an internal crystal polarized in an arbitrary direction, and includes electrodes provided on at least two surfaces opposed in a thickness direction thereof; a driver power supply for applying a voltage between the electrodes to generate strain in the piezoelectric element; resistors provided above the piezoelectric element; and a displacement detection device connected with the resistors, for detecting a change in resistance value to detect an amount of strain of the piezoelectric element. Electrodes are absent in regions of the piezoelectric element in which the resistors are provided.

For each of the resistors used for the piezoelectric actuator provided with a displacement meter according to the present invention, a semiconductor is used.

According to the present invention, the piezoelectric actuator provided with a displacement meter having the structure as described above is used to construct a positioning device.

The electrode portions of the piezoelectric element on which the resistors are provided are connected with the ground electrode, or have the same potential as the voltages applied to the resistors. Therefore, even when a resistor is provided on a base sheet made of an insulator, a potential difference between the electrode surface of the piezoelectric element and the resistor or a resistor connection electrode connected with the resistor does not substantially occur. Thus, even when a high voltage is applied to the piezoelectric element to be driven, a capacitance component is not substantially generated, with the result that a detection signal indicating the change in resistance value is not influenced by the capacitance component. When an insulation resistance of a base material is low, a leak current does not substantially flow. Therefore, the amount of strain of the piezoelectric member can be accurately measured, and hence the detection precision of a displacement of the piezoelectric actuator is significantly improved. As a result, movement precision of the positioning device using the piezoelectric actuator is significantly improved.

A phenomenon (migration) does not occur in which a resistor or a lead wire connected with the resistor is brought into contact with an electrode associated with the piezoelectric element, or the resistor or a resistor connection electrode connected with the resistor and located on the insulator is connected with the electrode of the piezoelectric element through the inner portion of the insulator on which the resistor is provided because of a change with time. Therefore, the resistor or the displacement detection device can be prevented from being broken by short circuit, and hence reliability and durability are improved.

DETAILED DESCRIPTION OF THE PREFERRED EMBODIMENTS

Hereinafter, a best mode for carrying out the present invention is described in detail with reference to the attached drawings.

Embodiment 1

Figure 1:
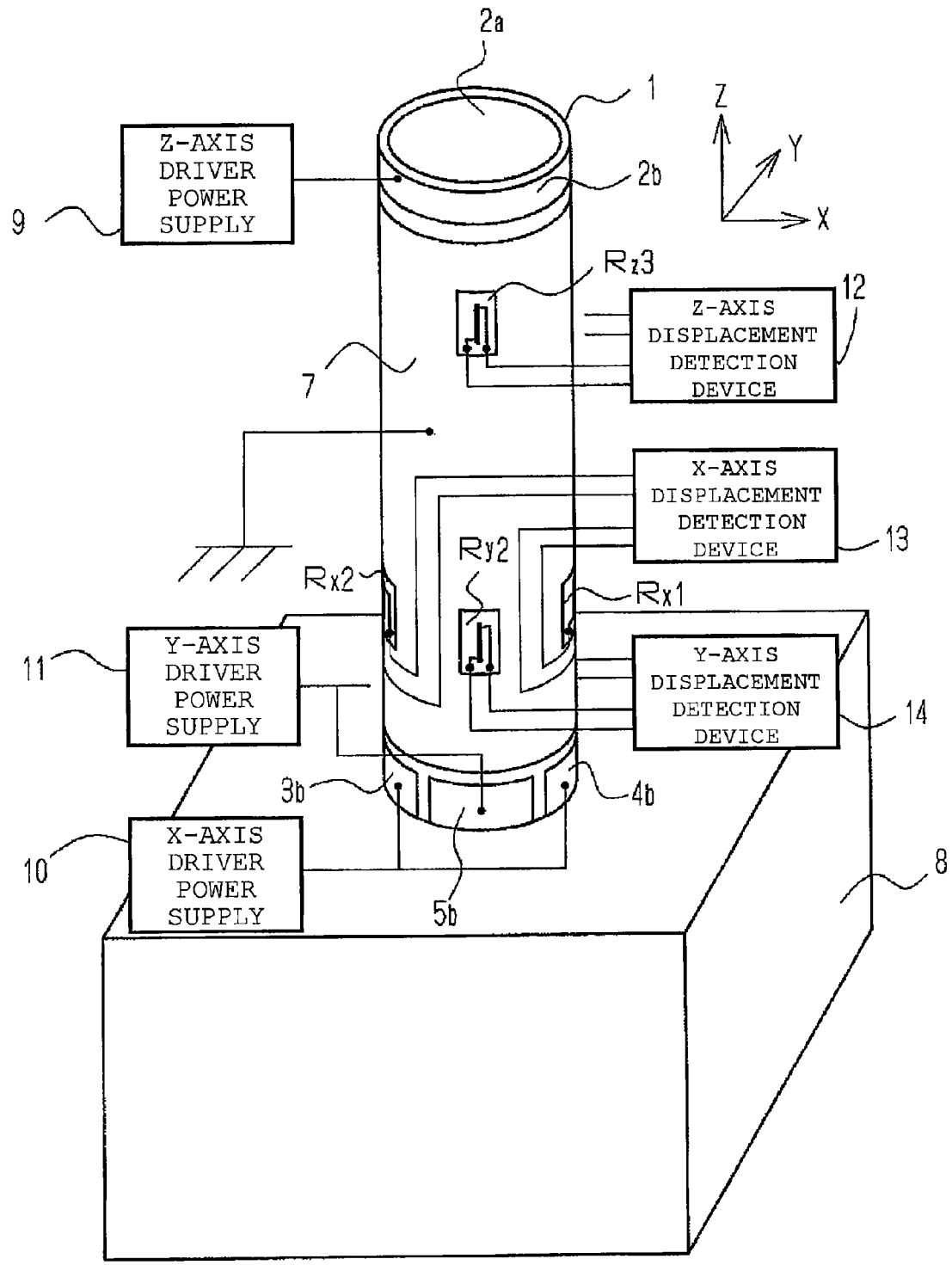
FIG. 1 is a schematic external view illustrating a cylindrical piezoelectric actuator provided with a displacement meter according to Embodiment 1 of the present invention.
Figure 2A:
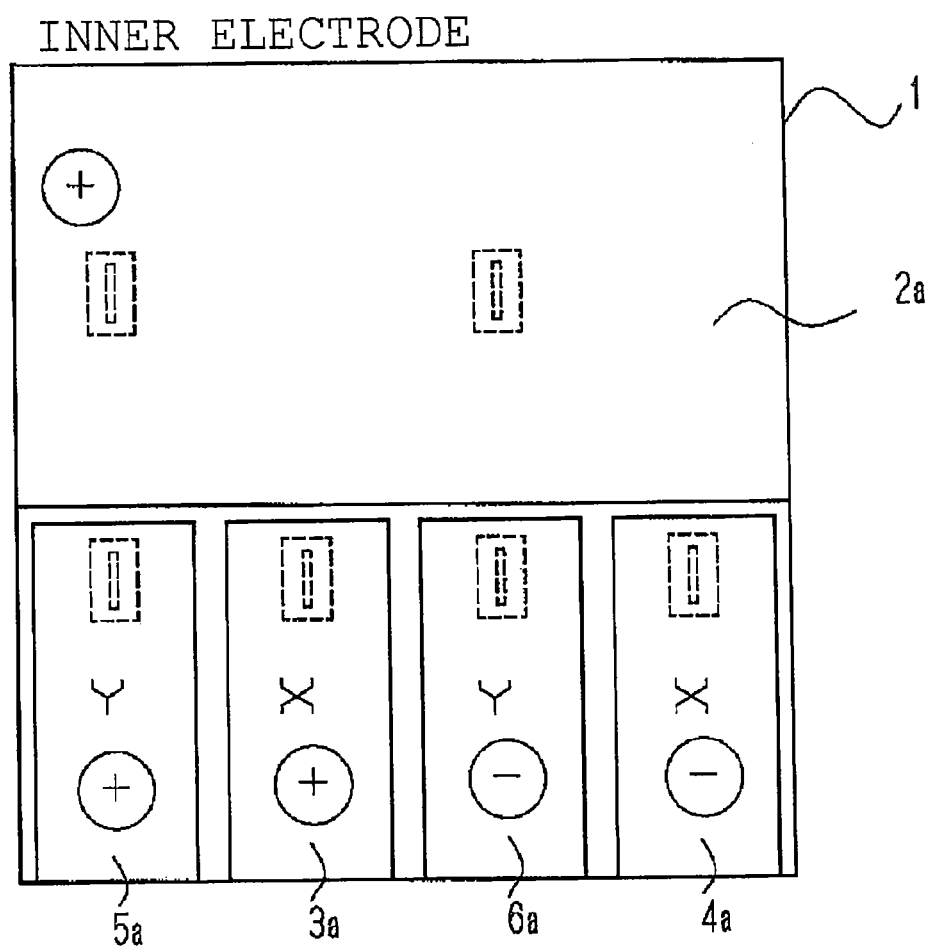
FIG. 2A is a developed view illustrating an inner surface of a cylindrical piezoelectric element used in Embodiment 1 of the present invention.
Figure 2B:
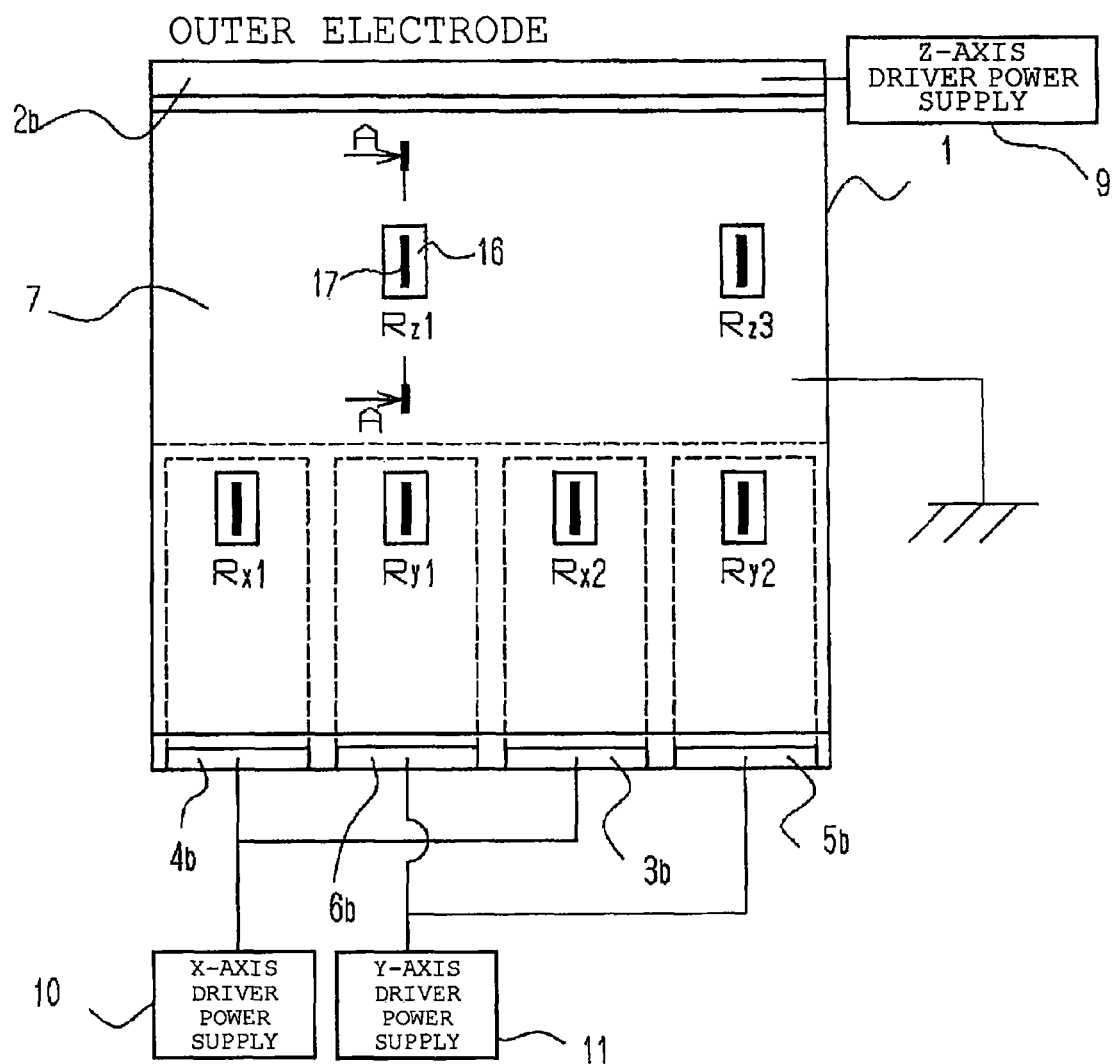
FIG. 2B is a developed view illustrating an outer surface of the cylindrical piezoelectric element used in Embodiment 1 of the present invention.

FIG. 1, FIGS. 2A and 2B, and FIGS. 3A and 3B illustrate a piezoelectric actuator provided with a displacement meter according to Embodiment 1 of the present invention. FIG. 1 is a schematic external view illustrating the piezoelectric actuator provided with a displacement meter. FIG. 2A is a developed view illustrating an inner surface of a cylindrical piezoelectric element used in FIG. 1. FIG. 2B is a developed view illustrating an outer surface of the cylindrical piezoelectric element.

In this embodiment, the cylindrical piezoelectric element as illustrated in FIG. 1 is used. In the cylindrical piezoelectric element 1, as illustrated in FIG. 2A, a band-shaped electrode portion 2a is uniformly provided in an upper portion of the inner surface along its circumference, and four-part electrode portions 3a, 4a, 5a, and 6a which are obtained by division into four parts along its circumference and formed in a direction parallel to a center axis of the cylinder are provided in a lower portion of the inner surface. As illustrated in FIG. 2B, a folded electrode portion 2b connected with the band-shaped electrode portion 2a located on the inner surface is provided in an upper end portion of the outer surface. Folded electrode portions 3b, 4b, 5b, and 6b connected with the four-part electrode portions 3a, 4a, 5a, and 6a located on the inner surface are provided in a lower end portion of the outer surface. A single band-shaped electrode portion 7 is formed in a portion except for the folded electrode portions along the circumference of the cylindrical piezoelectric element 1.

The entire length of the cylindrical piezoelectric element 1 is 100 mm and an outer diameter thereof is 15 mm. A thickness between the inner surface and the outer surface thereof is 1 mm. A length of each of the four-part electrode portions 3a, 4a, 5a, and 6a is 50 mm. A length of the band-shaped electrode portion 2a is 45 mm. The cylindrical piezoelectric element 1 is polarized so that inner crystals have polarity in a direction orthogonal to the center axis of the cylinder between the inner surface and the outer surface. The polarization polarity varies according to the surfaces of the split electrodes located on the inner surface, which have polarities indicated by signs of FIG. 2A. The plus sign indicates a portion in which the band-shaped electrode portion 7 located on the outer surface is set to have a ground potential when polarization is performed, and then a plus voltage is applied to the inner surface to perform polarization treatment. The inner crystals of the cylindrical piezoelectric element have minus polarity oriented to the inner surface. Each of such electrodes that are polarized is referred to as a plus electrode. The minus sign indicates a portion in which the band-shaped electrode portion 7 located on the outer surface is set to have the ground potential when polarization is performed, and then a minus voltage is applied to the inner surface to perform polarization treatment. The inner crystals of the cylindrical piezoelectric element have plus polarity oriented to the inner surface. Each of such electrodes that are polarized is referred to as a minus electrode. It is assumed that a name of the polarity of each of the electrodes in this specification is based on the definition described above. In the cylindrical piezoelectric element 1 according to this embodiment, the band-shaped electrode portion 2a located on the inner surface is the plus electrode, and the four-part electrode portions 3a, 4a, 5a, and 6a are polarized so that the electrode portions 3a and 4a which are opposed to each other about the center axis are reversed in polarity to each other and the electrode portions 5a and 6a which are opposed to each other about the center axis are reversed in polarity to each other.

The side on which the band-shaped electrode portion 2a located on the inner surface of the cylindrical piezoelectric element is provided is assumed to be a tip portion. The side on which the four-part electrode portions 3a, 4a, 5a, and 6a are provided is assumed to be a terminal portion. It is assumed that a direction of the center axis is a Z-axis, a direction which is orthogonal to the Z-axis and corresponds to a lateral direction of the sheet of FIG. 1 is an X-axis, and a direction perpendicular to the sheet is a Y-axis. When the cylindrical piezoelectric actuator is used, the terminal portion is normally fixed to a base block 8.

The band-shaped electrode portion 7 is connected with the ground. The folded electrode portion 2b connected with the band-shaped electrode portion 2a located on the inner surface is connected with a Z-axis driver power supply 9. Among the folded electrode portions 3b, 4b, 5b, and 6b located on the outer surface, which are connected with the four-part electrode portions 3a, 4a, 5a, and 6a located on the inner surface, the two electrode portions 3b and 4b opposed to each other in the X-axis direction are connected with an X-axis driver power supply 10, and the two electrode portions 5b and 6b opposed to each other in the Y-axis direction are connected with a Y-axis driver power supply 11. Note that the folded electrode portions 2b, 3b, 4b, 5b, and 6b are not necessarily provided and the electrode portions 2a, 3a, 4a, 5a, and 6a located on the inner surface may be directly connected with the driver power supplies. However, when the folded electrode portions are provided, connection electrodes for the driver power supplies can be provided outside the cylinder, and thus the connection is easily made. When the band-shaped electrode portion 7 located on the outer surface is connected with the ground, the band-shaped electrode portion 7 is grounded or connected on one of ground sides of the driver power supplies 9, 10, and 11.

When a voltage is applied from the Z-axis driver power supply 9 to the cylindrical piezoelectric actuator whose electrode portions are connected as described above, the inner crystals of the piezoelectric element cause strain in its thickness direction by the action of attraction or repulsion according to the polarity of the applied voltage. The strain also causes strain in the Z-axis direction, whereby a displacement of the piezoelectric element occurs in the Z-axis direction. When a voltage of plus polarity is applied from the Z-axis driver power supply 9, strain occurs in a direction in which a thickness increases. As a result, a displacement occurs in a contraction direction along the Z-axis. In contract to this, when a voltage of minus polarity is applied, a displacement occurs in an extension direction along the Z-axis.

When a voltage is applied from the X-axis driver power supply 10, a thickness of one of the opposed electrode portions 3a and 4a increases and a thickness of the other thereof reduces, because the crystal polarity varies therebetween. As a result, the one electrode portion contracts in the direction parallel to the center axis, and the other electrode portion is displaced in the extension direction, whereby the cylindrical piezoelectric actuator is bent in the X-axis direction about a fixed end of the terminal portion, and the tip portion performs arc motion. In this case, the displacement during the arc motion is extremely small and thus can be assumed to be a displacement in the direction substantially parallel to the X-axis. When the polarity of the voltage of the X-axis driver power supply 10 is reversed, the tip portion can be moved in each of the positive and negative directions about the center axis. In the case of the Y-axis, when a voltage is applied between the opposed electrode portions 5a and 6a by the Y-axis driver power supply 11, the tip portion can be displaced in the Y-axis direction based on the same principle as in the case of the X-axis. As a result, when the applied voltages of the X-axis and the Y-axis are controlled, the tip portion of the piezoelectric element can be moved in an arbitrary direction on the X-Y plane. In this embodiment, the driving voltage applied to each of the electrode portions for each axis is in a range of −200 V to +200 V, and thus the tip portion can be moved on the X-Y plane by 100 μm and in the Z-axis direction by 10 μm. A cylindrical piezoelectric element having the same polarities as the polarities of the opposed electrode portions of the four-part electrode portions 3a, 4a, 5a, and 6a may be used. However, in this case, in order to bend and deform the cylindrical piezoelectric element, it is necessary to apply voltages reversed in polarity to each other from two power supplies to the electrode portions for each axis. Therefore, in the case of the two axes (X-axis and Y-axis), four driver power supplies are required in total. As in this embodiment, the polarization is performed so that the opposed electrode portions 3a and 4a are different in polarity from each other and the opposed electrode portions 5a and 6a are different in polarity from each other. In addition, a driver power supply is used for each axis, that is, two driver power supplies are used in total for the two axes (X-axis and Y-axis), and the voltages of the same polarity are applied from the two driver power supplies. Thus, the movement within the X-Y plane can be realized.

Next, a method of detecting a displacement of the cylindrical piezoelectric actuator according to this embodiment is described. The piezoelectric actuator is normally used to generate a minute displacement of the order of sub-nanometers to several hundred micrometers. Normal strain measurement precision required in a case where the displacement of the piezoelectric actuator is measured based on strain thereof is approximately $10^{-8}$ to $10^{-3}$. In order to measure such minute strain with high sensitivity, a strain gauge including a resistor made of a semiconductor is used in this embodiment.

Figure 3A:
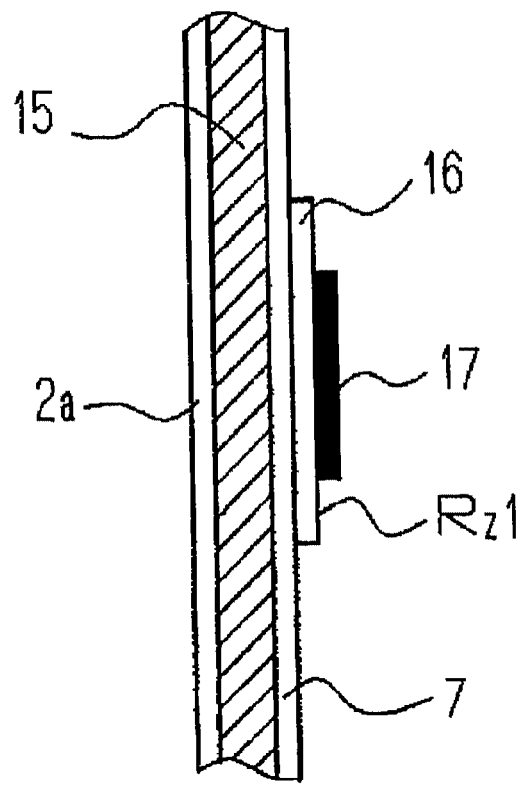
FIG. 3A is a cross-sectional view taken along an A-A line of FIG. 2B
Figure 3B:
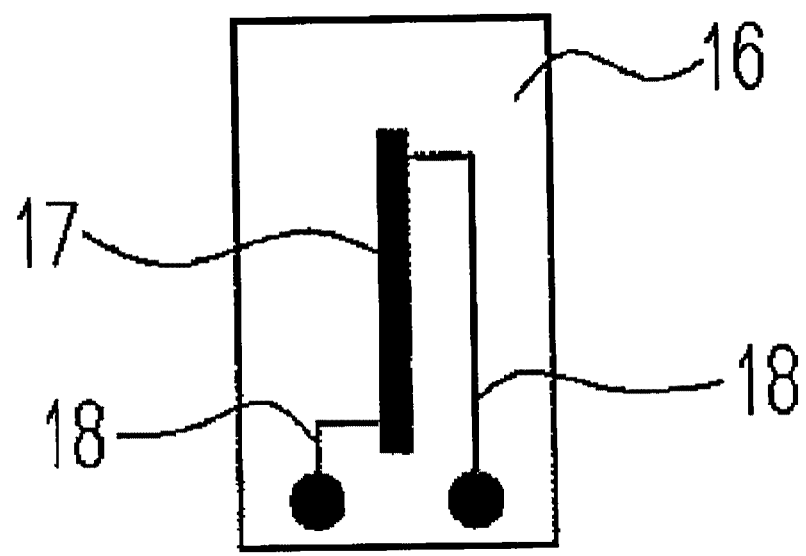
FIG. 3B is a front view of FIG. 3A.

FIGS. 3A and 3B illustrate a structure of the strain gauge used in this embodiment and a method of fixing the strain gauge to the piezoelectric element. FIG. 3A is a cross-sectional view taken along an A-A line, illustrating a strain gauge Rz1 attached to the piezoelectric element in FIG. 2B. FIG. 3B is a front view illustrating the strain gauge Rz1. In this embodiment, the other strain gauges have the same structure. In the strain gauge Rz1, a linear resistor 17 made of an n-type semiconductor is attached onto the band-shaped electrode portion 7 through a base material 16. The band-shaped electrode portion 7 is formed on an outer surface of an element main body 15 of the piezoelectric element 1 and made of nickel. The base material 16 is made of an insulator such as a polyimide resin having a thickness of 15 µm. As illustrated in FIG. 3B, both ends of the linear resistor 17 are connected with resistor connection electrodes 18 which are made of nickel and formed on the base material 16 by patterning. The resistor 17 and the resistor connection electrodes 18 are formed on the base material 16 in advance by patterning to serve as the strain gauge Rz1. The base material 16 is bonded to the band-shaped electrode portion 7 of the piezoelectric element by an epoxy adhesive.

The strain gauges Rz1 and Rz3 for measuring Z-axis strain are bonded at two positions of the band-shaped electrode portion 7 (outer surface) provided on a surface side of the band-shaped electrode portion 2a located on the inner surface so that the longitudinal direction of the linear resistor 17 is parallel to the center axis. The two resistors (Rz1 and Rz3) are connected with a Z-axis displacement detection device 12 provided outside the piezoelectric element 1 through the resistor connection electrodes 18.

Figure 4:
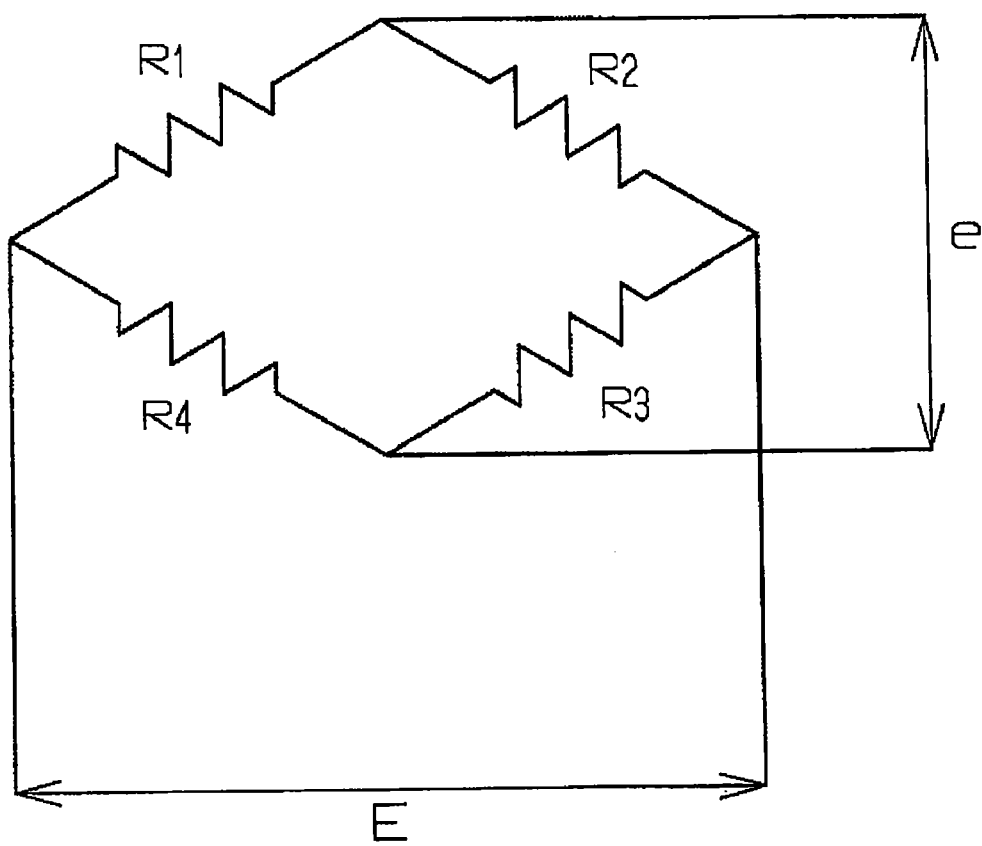
FIG. 4 is a circuit diagram illustrating a displacement detection device.

Here, a detection principle of the displacement detection device is described with reference to FIG. 4. FIG. 4 is an electrical circuit diagram composed of the resistors attached to the piezoelectric element and the displacement detection device provided outside the piezoelectric element 1. In the displacement detection device, four resistors in total, that is, the displacement detection resistors and fixed resistors connected in the displacement detection device are used to form a bridge circuit. Note that numbers of the respective resistors illustrated in FIG. 4 correspond to the numbers of the displacement detection resistors attached to the respective electrode portions, and resistors other than the resistors attached to the piezoelectric element serve as the fixed resistors provided in the displacement detection device. The other embodiments of the present invention are also described correspondingly to numbers of the respective resistors to be attached to the piezoelectric element with reference to the circuit diagram illustrated in FIG. 4.

The resistors (Rz1 and Rz3) for Z-electrode are incorporated into portions R1 and R3 of the circuit illustrated in FIG. 4. A resistance value of each of the resistors (Rz1 and Rz3) is 120Ω. Fixed resistors, each having a resistance value of 120Ω, are incorporated into portions R2 and R4. Here, a bridge voltage E is applied to the bridge circuit. In this embodiment, the applied bridge voltage E is 2 V. The bridge voltage E may be a direct current voltage or an alternating current voltage. In this embodiment, an alternating current voltage of 30 kHz is used to improve noise immunity.

When the Z-axis displacement detection device 12 having the structure as described above detects a strain $\in$ of the piezoelectric element, an output voltage "e" is expressed by the following expression.

$$e = KE \in /2$$

In the expression, K represents a gauge factor determined according to a resistor material. In the case of the n-type semiconductor also used in this embodiment, the gauge factor is approximately −100. Note that a normal gauge factor of a general strain gauge using resistors made of a metal material such as a copper nickel alloy is approximately two. Therefore, when a semiconductor gauge is used, detection sensitivity is improved by approximately 50 times.

From the expression, when the output voltage E is measured, the amount of strain $\in$ can be determined. Therefore, the displacement of the piezoelectric element is determined based on the determined amount of strain.

Two strain gauges Rx1 and Rx2 are bonded to the band-shaped electrode portion 7 (outer surface) located on the surface side of the four-part electrode portions at positions corresponding to the X-electrode portions 3a and 4a, and two strain gauges Ry1 and Ry2 are bonded to the band-shaped electrode portion 7 located thereon at positions corresponding to the Y-electrode portions 5a and 6a. Fixed resistors are incorporated into the portions R3 and R4 illustrated in FIG. 4. The respective resistors have the same characteristics as in the case of the Z-electrode portions. In this case, an output voltage "e" of each of an X-axis displacement detection device 13 and a Y-axis displacement detection device 14 is expressed by the following expression.

$$e = KE \in /2$$

Therefore, an X-axis displacement can be determined based on the output voltage of the X-axis displacement detection device 13, and a Y-axis displacement can be determined based on the output voltage of the Y-axis displacement detection device 14.

Figure 5A:
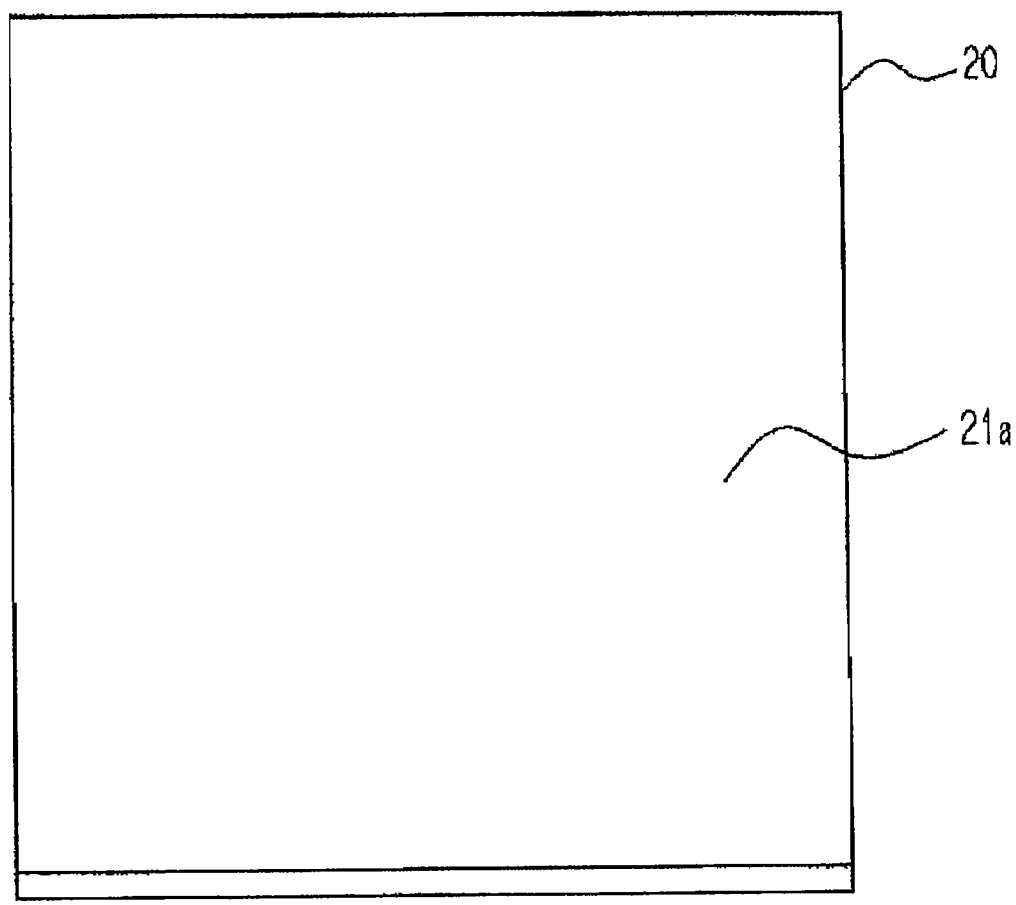
FIG. 5A is a developed view illustrating an inner surface of a conventional cylindrical piezoelectric element.
Figure 5B:
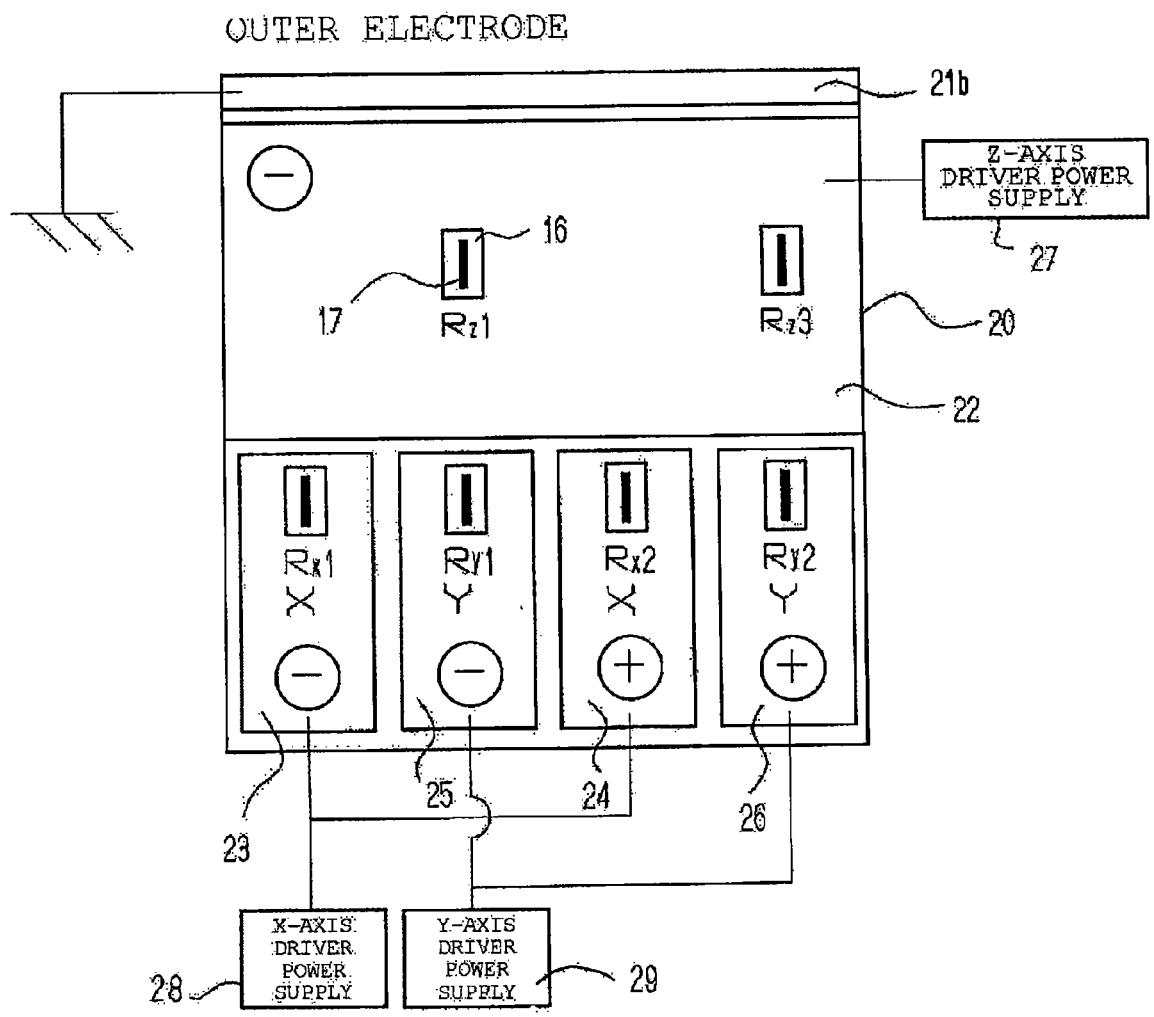
FIG. 5B is a developed view illustrating an outer surface of the conventional cylindrical piezoelectric element.

Here, FIGS. 5A and 5B illustrate an electrode pattern on an inner surface of a conventional piezoelectric actuator provided with a displacement meter, and an electrode pattern on an outer surface thereof, and a method of attaching resistors to the electrode patterns. In this conventional technology, the inner electrode portion and the outer electrode portions as illustrated in FIGS. 2A and 2B are merely interchanged therebetween, and hence a shape of the piezoelectric element and shapes of the electrode portions are not changed. Therefore, the same piezoelectric element is used in principle, and hence the same movement amount characteristic is exhibited. In the conventional technology, a single band-shaped electrode portion 21a is provided on the inner surface of a cylindrical piezoelectric element 20 along its circumference. A folded electrode portion 21b connected with the band-shaped electrode portion 21a located on the inner surface is provided in a tip portion of the outer surface. A band-shaped electrode portion 22 is provided on a lower side of the folded electrode portion 21b along its circumference. Four-part electrode portions 23, 24, 25, and 26 which are obtained by division into four parts along the circumference and formed in the direction parallel to the center axis are provided on a lower side of the band-shaped electrode portion 22. The band-shaped electrode portion 22 located on the outer surface is polarized to minus. The four-part electrode portions 23, 24, 25, and 26 are polarized so that the electrode portions 23 and 24 which are opposed to each other about the center axis are reversed in polarity to each other, and the electrode portions 25 and 26 which are opposed to each other about the center axis are reversed in polarity to each other. The folded electrode portion 21b which is located on the outer surface and serves as the inner electrode portion is connected with the ground. The band-shaped electrode portion 22 located on the outer surface is connected with a Z-axis driver power supply 27. Among the four-part electrode portions, the corresponding two electrode portions 23 and 24 are connected with an X-axis driver power supply 28 and the corresponding two electrode portions 25 and 26 are connected with a Y-axis driver power supply 29.

The same strain gauges as illustrated in FIG. 2B are used as displacement detection resistors of the piezoelectric element 20. Two strain gauges Rz1 and Rz3 are attached onto the band-shaped electrode portion 22 located on the outer surface. Strain gauges Rx1, Rx2, Ry1, and Ry2 are attached onto the four-part electrode portions 23, 24, 25, and 26, respectively. The respective resistors are connected with a Z-axis displacement detection device, an X-axis displacement detection device, and a Y-axis displacement detection device (not shown) to form the bridge circuit illustrated in FIG. 4.

The electrode portions for Z-axis of the piezoelectric actuators with a displacement meter illustrated in FIGS. 2A, 2B, 5A, and 5B are manufactured so that the polarization polarities thereof are different from each other as illustrated in FIGS. 2B and 5B for convenience of manufacture. Therefore, when voltages which are equal to each other in magnitude and polarity are applied from the Z-axis driver power supplies 9 and 27, displacements which have the same magnitude and different shift direction are obtained. The electrode portions for each of X-axis and Y-axis are manufactured so that the polarities thereof are equal to each other as illustrated in FIGS. 2B and 5B. Therefore, when voltages which are equal in magnitude and polarity to each other are applied from the driver power supplies, displacements which are equal to each other in magnitude and shift direction are obtained.

Of the two resistors of the electrode portions for Z-axis of the piezoelectric actuators illustrated in FIGS. 2B and 5B, only the resistor (Rz1) is connected with the portion R1 of the bridge circuit illustrated in FIG. 4, and the remaining resistors are provided as fixed resistors. Then, an output is determined in a case where a voltage is applied from the Z-axis driver power supply 9 and 27.

Figure 6A:
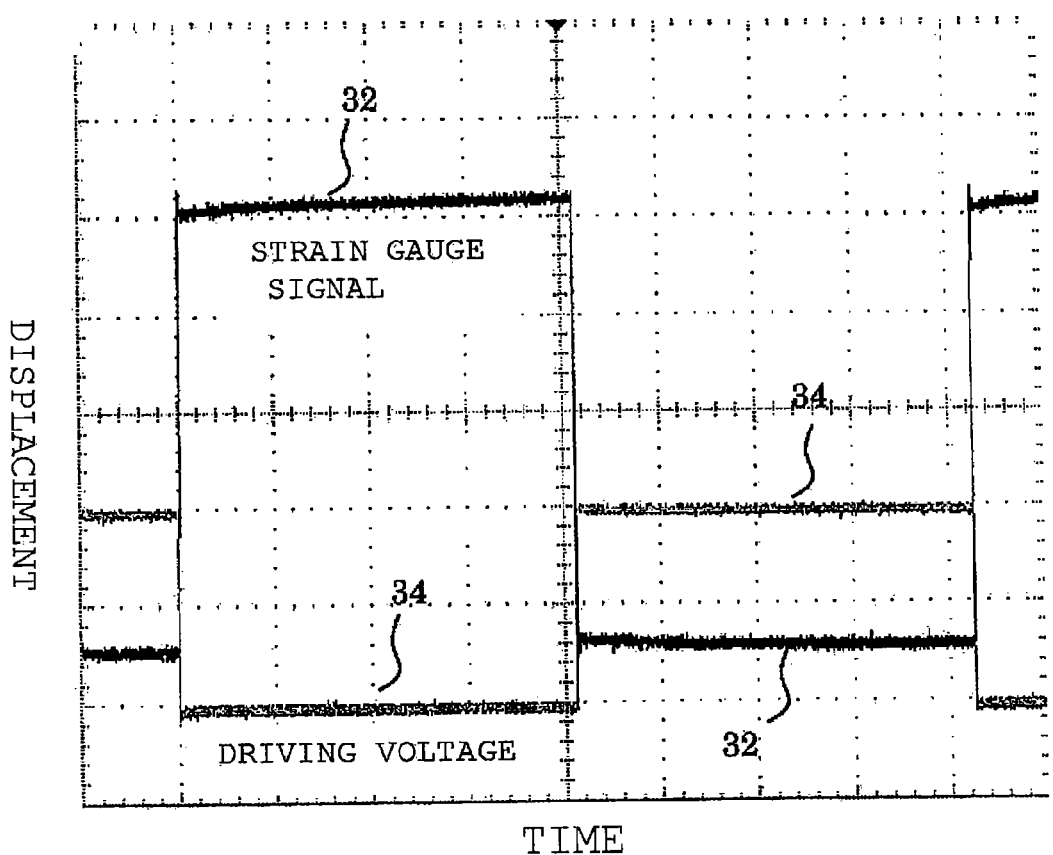
FIG. 6A illustrates detection data of a strain gauge in a case where a rectangular wave is applied to a Z-axis of the cylindrical piezoelectric actuator provided with a displacement meter according to the present invention of FIGS. 2A and 2B.
Figure 6B:
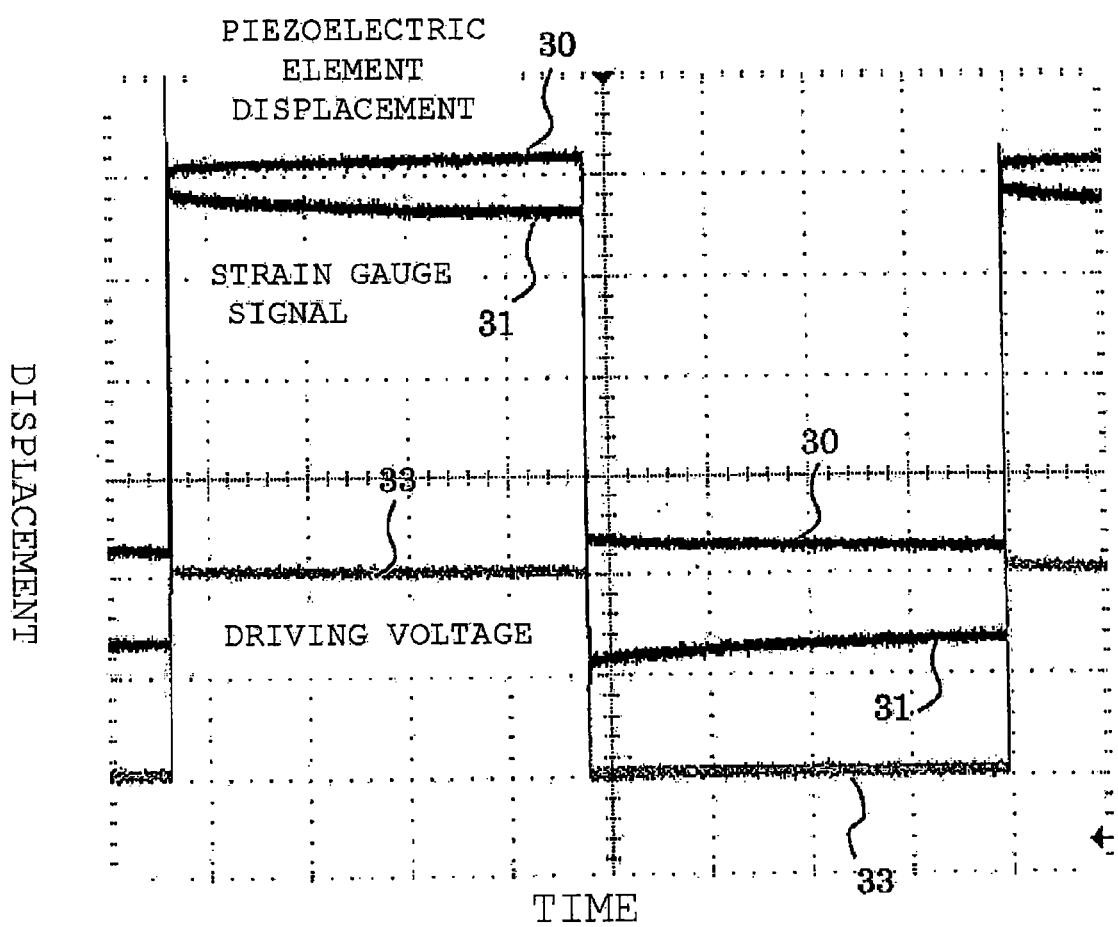
FIG. 6B illustrates displacement data determined by an interferometer and detection data of a strain gauge in a case where the rectangular wave is applied to a Z-axis of the conventional cylindrical piezoelectric actuator provided with a displacement meter of FIGS. 5A and 5B.
Figure 7A:
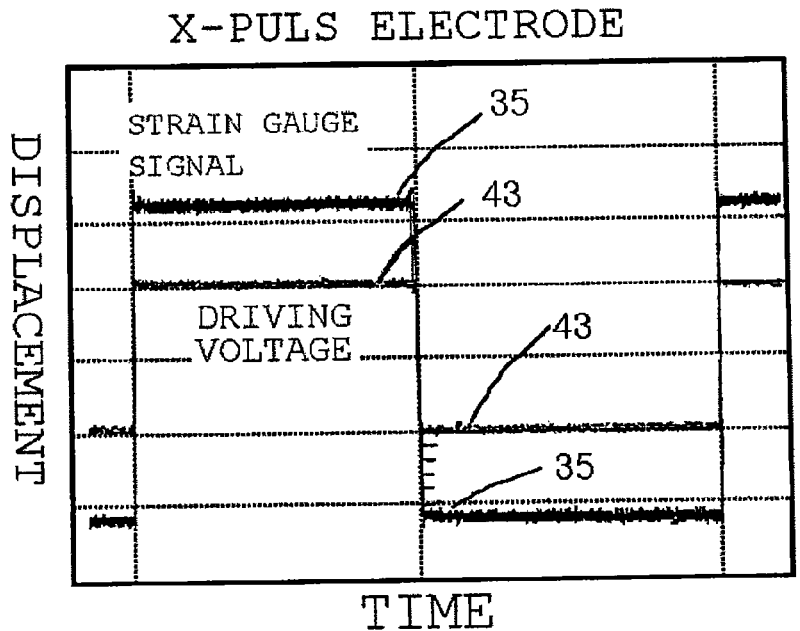
FIGS. 7A to 7D illustrate detection data of strain gauges provided to respective electrodes in an X-axis and a Y-axis of the conventional cylindrical piezoelectric actuator provided with a displacement meter of FIGS. 5A and 5B in a case where rectangular waves are applied to the respective electrodes.
Figure 7B:
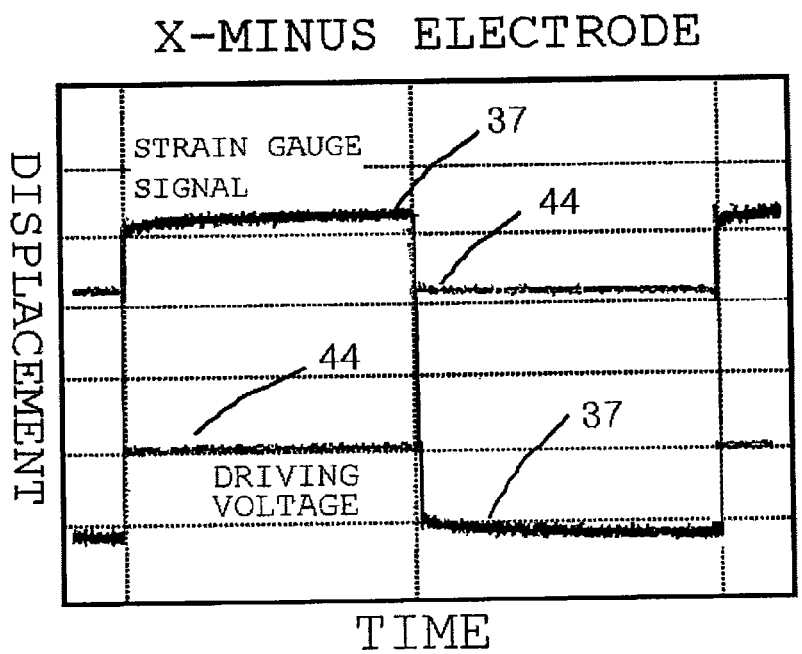
Figure 7C:
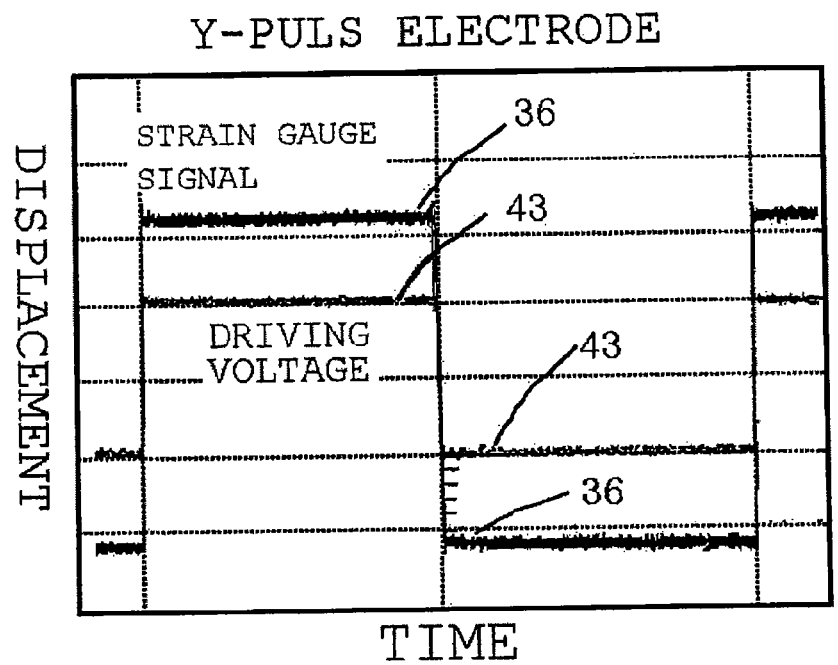
Figure 7D:
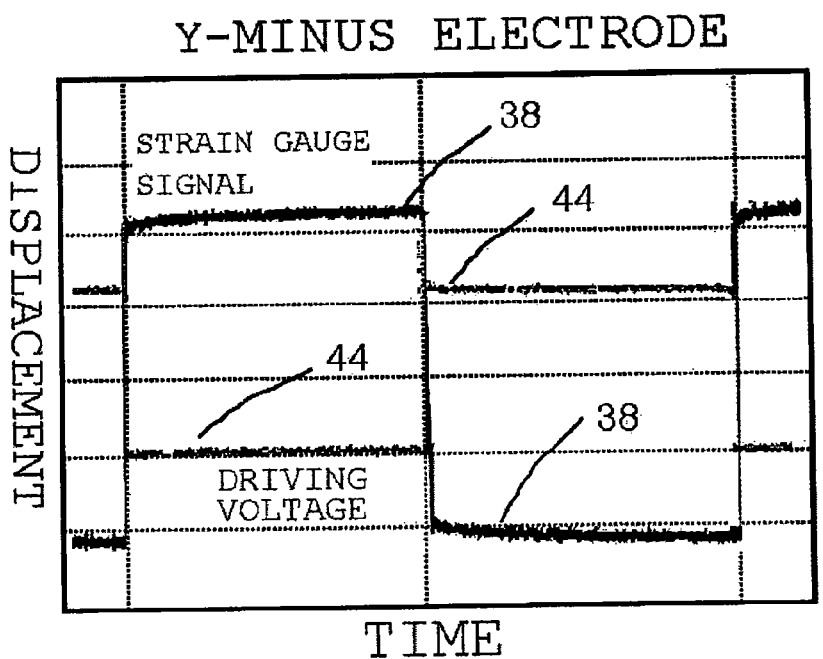
Figure 8A:
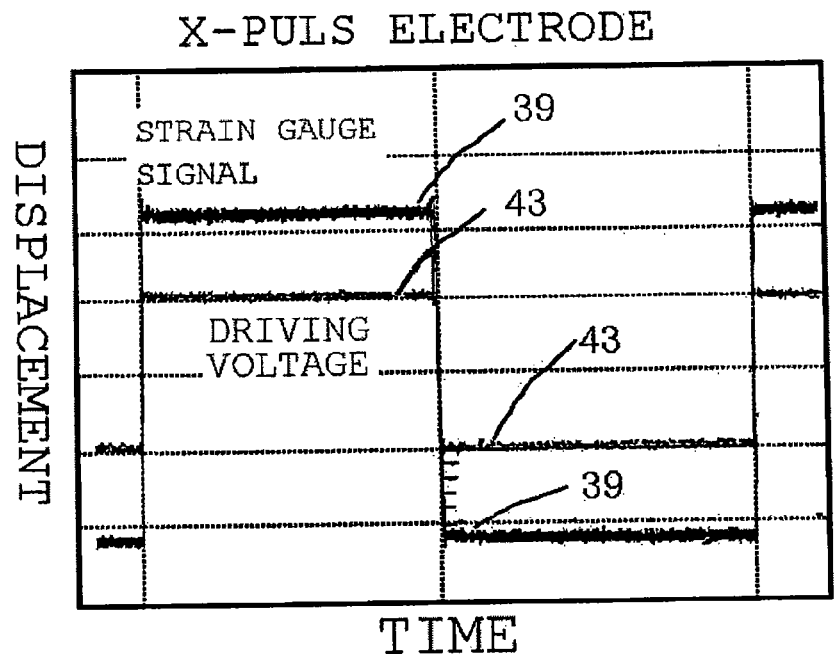
FIGS. 8A to 8D illustrate detection data of strain gauges provided to respective electrodes in an X-axis and a Y-axis of the cylindrical piezoelectric actuator provided with a displacement meter according to the present invention of FIGS. 2A and 2B in a case where rectangular waves are applied to the respective electrodes.
Figure 8B:
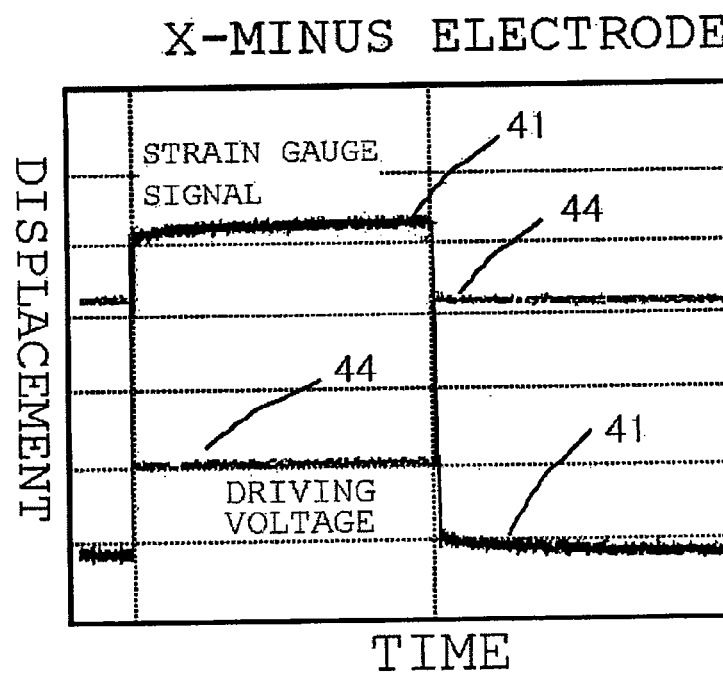
Figure 8C:
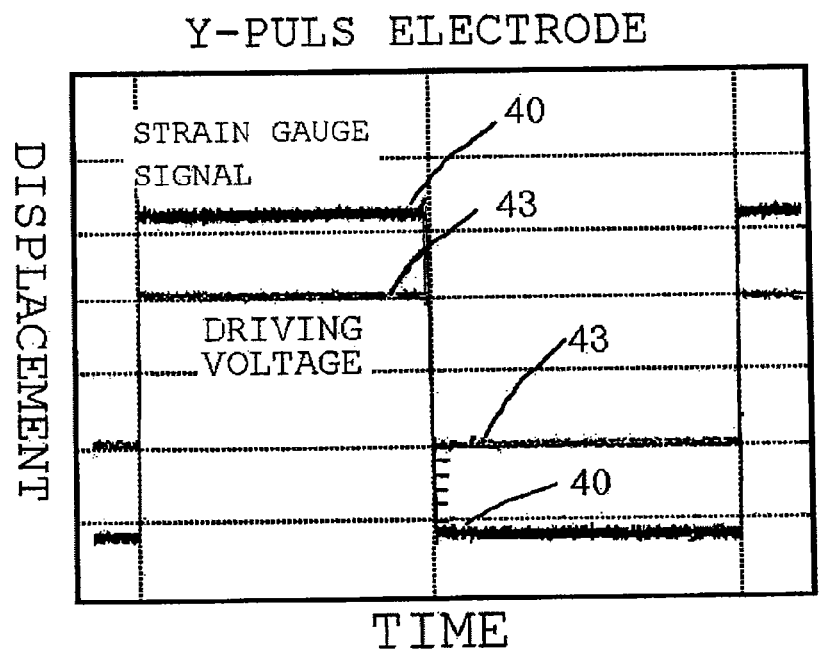
Figure 8D:
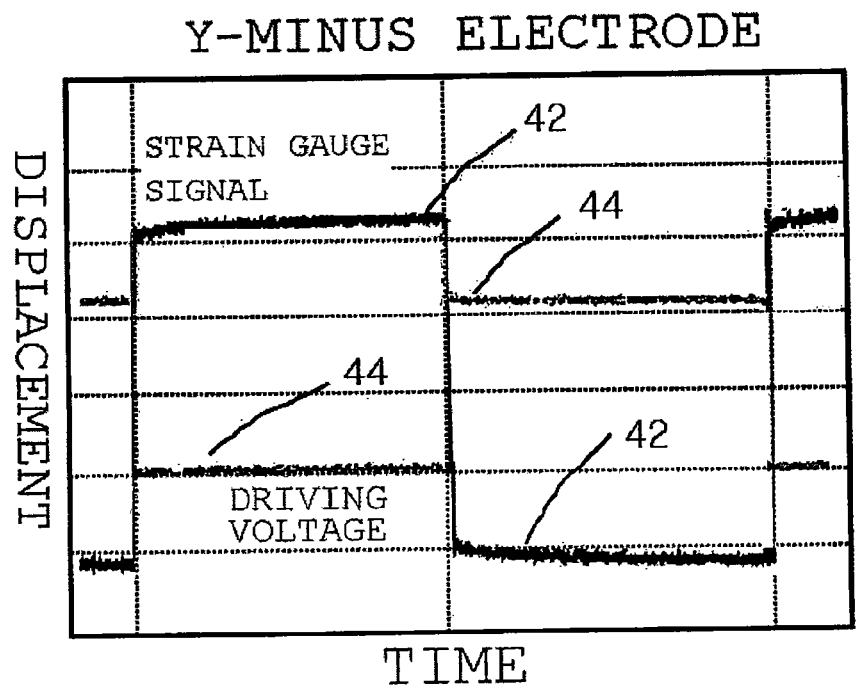

FIGS. 6A and 6B illustrate results obtained by displacement detection by the strain gauge Rz1 in a case where a rectangular wave 34 having voltage of 0 V to −100 V and frequency of 0.12 Hz is input to the piezoelectric actuator illustrated in FIGS. 2A and 2B, and a rectangular wave 33 having voltage of 0 V to +100 V and frequency of 0.12 Hz is input to the piezoelectric actuator illustrated in FIGS. 5A and 5B, to thereby displace the piezoelectric actuators illustrated in FIGS. 2B and 5B in the same direction, and results obtained by measuring displacements of the tip portions of the piezoelectric actuators by an optical displacement meter (interferometer) which is separately provided and formed to have an accurate displacement. FIG. 6A illustrates a case where the electrode portion 7 provided with the resistor (Rz1) of FIG. 2B has a ground potential. FIG. 6b illustrates a case of the conventional technology in which a driving voltage is applied to the electrode portion 22 provided with the resistor (Rz1). When the voltage is shifted to increase, each of a detection signal of the strain gauge and a detection signal of the displacement meter exhibits that the piezoelectric element is displaced in a direction in which the tip portion contracts. There is observed a state in which a piezoelectric element displacement 30 measured by the displacement meter as illustrated in FIG. 6B is increased by a distance because of the application of voltage and then gradually creeps with time in a displacement direction. In contrast, there is observed a state in which an output 31 of the displacement detection device using the resistor (Rz1) as illustrated in FIG. 6B creeps in a direction completely opposite to the displacement direction of the piezoelectric element displacement 30. On the other hand, the results illustrated in FIG. 6A reveal that a direction of an output 32 of the displacement detection device using the resistor (Rz1) is aligned with the creep direction of the piezoelectric element displacement 30 measured by the displacement meter as illustrated in FIG. 6B, and thus the displacement of the piezoelectric actuator is accurately measured. In this experiment, the polarization polarities of the electrode portions are reversed in consideration of the convenience of manufacturing the device, and thus driving voltage is reversed between FIG. 6A and FIG. 6B, which has no effects on the measurement results.

The measurement described above is performed also in a case where a rectangular wave having voltage of 0 V to +100 V and frequency of 0.12 Hz is input to the piezoelectric actuator illustrated in FIGS. 2A and 2B, and a rectangular wave having voltage of 0 V to −100 V and frequency of 0.12 Hz is input from the Z-axis driver power supply to the piezoelectric actuator illustrated in FIGS. 5A and 5B, to thereby displace the piezoelectric actuators in the reverse directions. As a result, the same characteristics are exhibited, and the detection characteristics of the resistor (Rz1) are independent of the direction of strain and the polarity of the applied voltage.

This is because, in the conventional piezoelectric actuator illustrated in FIG. 5, the resistor (Rz1) is attached through the insulator to the band-shaped electrode portion 22 of the piezoelectric element to be connected with the Z-axis driver power supply 27, whereby a structure is formed so that the base material (insulator) 16 is sandwiched between the band-shaped electrode portion 22 of the piezoelectric element and one of the resistor 17 and the connection electrode portion (not shown) connected with the resistor. Therefore, a potential difference is generated between the band-shaped electrode portion 22 and the one of the resistor 17 and the connection electrode portion, whereby the structure acts like a capacitor. Thus, a capacitance component generated in the capacitor influences a signal from the Z-axis displacement detection device (not shown). When the band-shaped electrode portion 7 provided with the resistor (Rz1) is set to have a ground potential as in the present invention illustrated in FIGS. 2A and 2B, the potential difference between the band-shaped electrode portion 22 and the one of the resistor 17 and the connection electrode portion is substantially zero, and hence accurate measurement can be performed without the generation of the capacitance component.

Also in the four-part electrode portions 3a, 4a, 5a, and 6a illustrated in FIG. 2B and the four-part electrode portions 23, 24, 25, and 26 illustrated in FIG. 5B, rectangular waves are applied between the opposed two electrode portions 3a and 4a for X-axis, between the opposed two electrode portions 23 and 24 for X-axis, between the opposed two electrode portions 5a and 6a for Y-axis, and between the opposed two electrode portions 25 and 26 for Y-axis, and each of resistors (Rx1, Ry1, Rx2, and Ry2) is incorporated into the bridge circuit, thereby measuring an output from the displacement detection device.

When outputs from the resistors (Rx2 and Ry2) for measuring strains of the electrode portions 3a, 5a, 24, and 26 having plus polarity are measured, a rectangular wave 43 having voltage of 0 V to +100 V and frequency of 0.12 Hz is applied to provide a displacement in the same direction. When outputs from the resistors (Rx1 and Ry1) for measuring strains of the electrode portions 4a, 6a, 23, and 25 having minus polarity are measured, a rectangular wave 44 having voltage of 0 V to −100 V and frequency of 0.12 Hz is applied to provide a displacement in the same direction.

FIGS. 7A to 7D illustrate measurement results on the conventional piezoelectric actuator illustrated in FIGS. 5A and 5B. FIGS. 8A to 8D illustrate measurement results on the piezoelectric actuator illustrated in FIGS. 2A and 2B according to the present invention. A direction in which an output voltage from a strain gauge increases corresponds to the direction in which the piezoelectric element contracts.

The results illustrated in FIGS. 7A to 7D reveal that the creep amount of each of output signals 35, 36, 37, and 38 from the strain gauges Rx1, Ry1, Rx2, and Ry2 is changed for each of the polarities of the electrode portions. The creep amount of each of the output signals 37 and 38 of the strain gauges Rx1 and Ry1 located on the minus electrode portions is larger than the creep amount of each of the output signals 35 and 36 of the strain gauges Rx2 and Ry2 located on the plus electrode portions. The output characteristics (35 and 36) on the electrode portions having the same polarity are identical to each other and the output characteristics (37 and 38) on the electrode portions having the same polarity are identical to each other. In contrast, the results illustrated in FIGS. 8A to 8D reveal that, when the band-shaped electrode portion 7 provided with the resistors (Rx1, Ry1, Rx2, and Ry2) is connected with the ground, the output signals 39, 40, 41, and 42 exhibit the same creep characteristic irrespective of the polarities of the electrode portions 3a, 4a, 5a, and 6a located on the inner surface side in the portions provided with the respective resistors (Rx1, Ry1, Rx2, and Ry2). Therefore, the movement of the tip portion of the piezoelectric element 1 matches the outputs of the strain gauges Rx1, Ry1, Rx2, and Ry2.

This is also because the capacitance component influences the output signals from the strain gauges as in the case of the Z-axis.

Note that, also in the case of the X- and Y-electrodes, when outputs from the resistors (Rx2 and Ry2) for measuring strains of the electrode portions 3a, 5a, 24, and 26 having plus polarity are measured, a rectangular wave having voltage of 0 V to −100 V and frequency of 0.12 Hz is applied. In addition, when outputs from the resistors (Rx1 and Ry1) for measuring strains of the electrode portions 4a, 6a, 23, and 25 having minus polarity are measured, a rectangular wave having voltage of 0 V to +100 V and frequency of 0.12 Hz is applied. Therefore, the outputs of the strain gauges in the case where the displacement is provided in a direction opposite to the direction of FIGS. 7A to 7D and 8A and 8D are measured. As a result, the same creep characteristics are exhibited, and the detection characteristics of the resistors are independent of the direction of strain and the polarity of the applied voltage.

When an insulation resistance is low because of the characteristics of the base material or the influence of humidify, a leak current flows to reduce measurement precision in some cases. However, when the surface on which the resistors are provided has the ground potential, almost no leak current is generated.

Therefore, when the surface on which the resistors are provided is set to have the ground potential as in the present invention, the piezoelectric actuator provided with a displacement meter in which the displacement can be detected with high precision by the resistors without the influence of the capacitance or the leak current is provided.

In the conventional piezoelectric actuator, the strain gauges are attached to the surface of the electrode portion applied with a high voltage. Therefore, in some cases, a resistor or a lead wire connected with the resistor is brought into contact with an electrode portion associated with the piezoelectric element, or the resistor or a resistor connection electrode connected with the resistor and located on the insulator is connected with the electrode portion of the piezoelectric element through the inner portion of the insulator provided with the resistor because of a change with time. Then, the resistor or the displacement detection device may be broken by short circuit. However, according to the present invention, the electrode portion to which the resistors are attached is set to have the ground potential, whereby such accident can be prevented to improve reliability and durability.

The electrode portion provided with the resistors is set to have the ground potential, and thus a noise level of the displacement detection apparatus itself is reduced. Further, when the piezoelectric actuator provided with a displacement meter is incorporated into the positioning device, noises are prevented from entering electrical wiring arranged around the piezoelectric actuator because most of electrodes located on the outer surface of the piezoelectric actuator are connected with the ground. Therefore, noise resistance performance of the positioning device is improved.

Embodiment 2

Figure 9A:
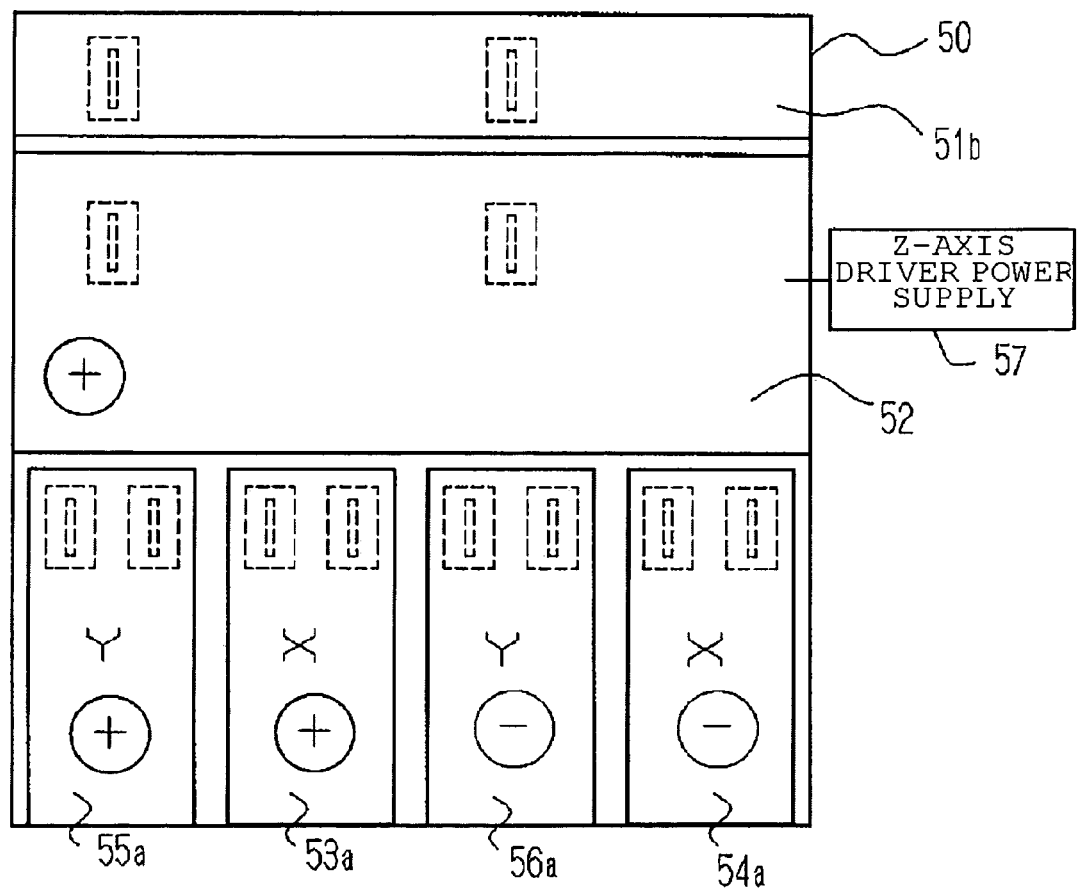
FIG. 9A is a developed view illustrating an inner surface of a cylindrical piezoelectric element according to Embodiment 2 of the present invention.
Figure 9B:
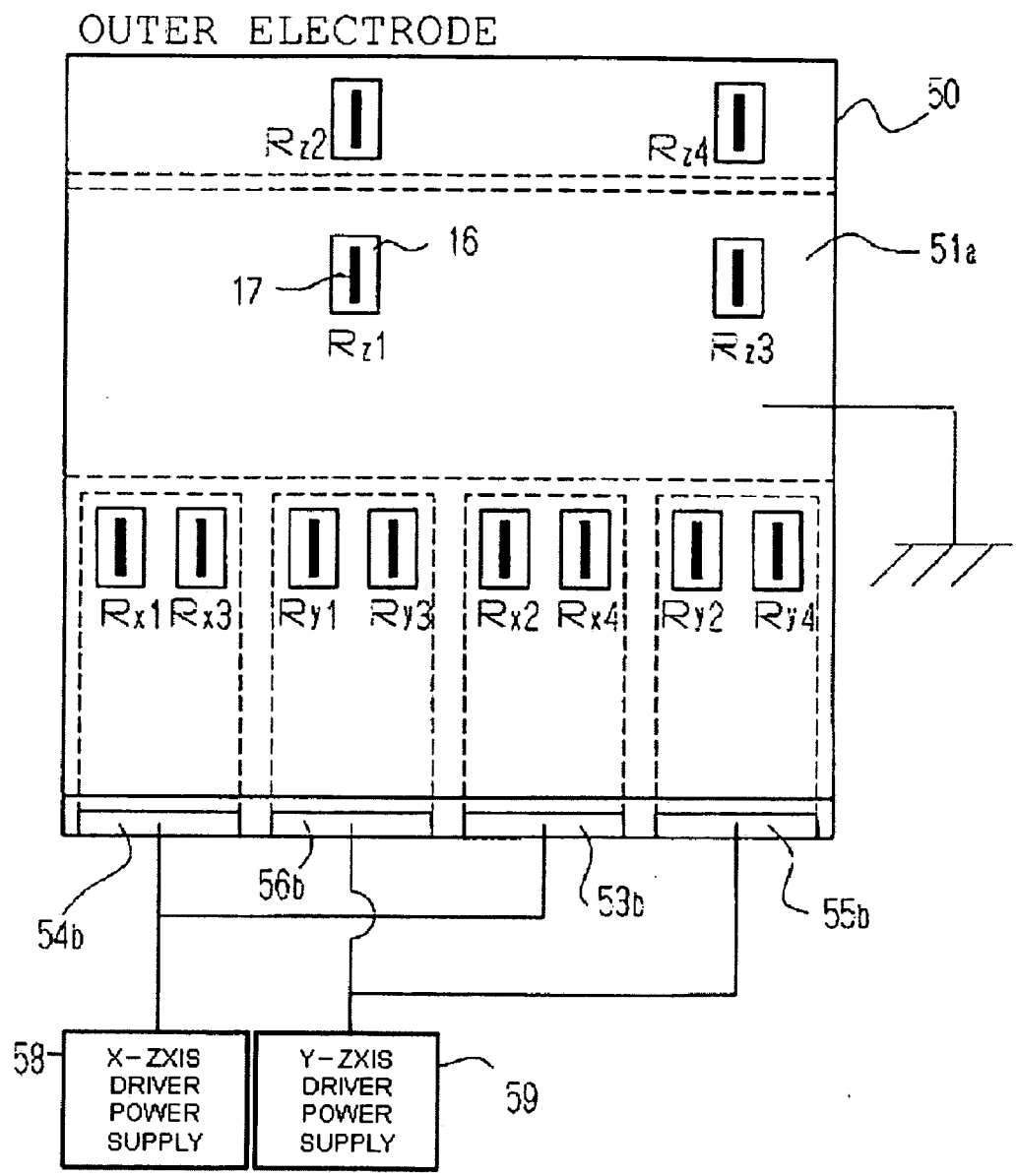
FIG. 9B is a developed view illustrating an outer surface of the cylindrical piezoelectric element according to Embodiment 2 of the present invention.

FIGS. 9A and 9B illustrate a piezoelectric element 50 of a cylindrical piezoelectric actuator with a displacement meter according to Embodiment 2 of the present invention. FIG. 9A is a developed view illustrating an inner surface of the cylindrical piezoelectric element. FIG. 9B is a developed view illustrating an outer surface of the cylindrical piezoelectric element.

In this embodiment, four resistors are arranged for each axis. The four resistors serve as a bridge circuit, thereby improving measurement sensitivity and compensating for apparent strain of the resistors due to a change in temperature. In this embodiment, as illustrated in FIG. 9A, a folded electrode portion 51b connected with a band-shaped electrode portion 51a located on the outer surface as described later is provided in an upper end portion of the inner surface. A band-shaped electrode portion 52 is provided under the folded electrode portion 51b. Four-part electrode portions 53a, 54a, 55a, and 56a which are obtained by dividing the circumference surface into four parts and formed in a direction parallel to the center axis are provided under the band-shaped electrode portion 52. The band-shaped electrode portion 52 is polarized as a plus electrode. The four-part electrode portions 53a, 54a, 55a, and 56a are polarized so that the electrode portions 53a and 54a which are opposed to each other about the center axis are reversed in polarity to each other, and the electrode portions 55a and 56a which are opposed to each other about the center axis are reversed in polarity to each other.

As illustrated in FIG. 9B, folded electrode portions 53b, 54b, 55b, and 56b connected with the four-part electrode portions 53a, 54a, 55a, and 56a located on the inner surface are provided in a lower end portion of the outer surface. A single band-shaped electrode portion 51a is formed on the other portion of the outer surface.

The band-shaped electrode portion 51a located on the outer surface is connected with ground. Among the folded electrode portions 53b, 54b, 55b, and 56b of the four-part electrode portions 53a, 54a, 55a, and 56a, which are located on the outer surface, the electrode portions 53b and 54b opposed to each other about the center axis are connected with an X-axis driver power supply 58 and the electrode portions 55b and 56b opposed to each other about the center axis are connected with a Y-axis driver power supply 59. The band-shaped electrode portion 52 located on the inner surface is connected with a Z-axis driver power supply 57.

Strain gauges having the same specifications as in Embodiment 1 are used as resistors (Rz1, Rz2, Rz3, and Rz4) for detecting a displacement of the piezoelectric element 50 in a perpendicular direction. The strain gauges Rz1 and Rz3 are bonded to two arbitrary positions such that the longitudinal direction of the linear resistor 17 is parallel to the center axis of the cylinder. The two arbitrary positions are set on the band-shaped electrode portion 51a which is located on the outer surface and connected with ground, and are provided on a surface side of the band-shaped electrode portion 52 located on the inner surface. The strain gauges Rz2 and Rz4 are bonded to two positions which are set on the band-shaped electrode portion 51a located on the outer surface and which are provided on a surface side of the folded electrode portion 51b located on the inner surface.

The strain gauges Rz1, Rz2, Rz3, and Rz4 are connected in the bridge circuit illustrated in FIG. 4. Even in this embodiment, numbers attached to the respective strain gauges illustrated in FIG. 9B correspond to the numbers of the resistors illustrated in FIG. 4.

When a voltage is applied from the Z-axis driver power supply 57 to the band-shaped electrode portion 52 located on the inner surface, the band-shaped electrode portion 52 acts as an active electrode. Then, a displacement occurs in the direction parallel to the center axis, and hence resistance values of the resistors (Rz1 and Rz3) attached to the surface side of the band-shaped electrode portion 52 located on the inner surface are changed according to the amount of strain caused by the displacement. The two resistors (Rz1 and Rz3) act as active gauges for strain measurement.

In contrast to this, the folded electrode portion 51b located on the inner surface is connected with the band-shaped electrode portion 51a located on the outer surface, and hence the folded electrode portion 51b acts as a dummy electrode. Therefore, strain does not occur. The two resistors (Rz2 and Rz4) attached to the folded electrode portion 51b are used as dummy gauges for temperature compensation. In a case of measurement using the strain gauges, the resistance values are changed because of a change in ambient temperature or heating of resistors. Then, apparent strain occurs, thereby reducing measurement precision. In particular, the semiconductor gauge used in this embodiment has high sensitivity, but the apparent strain is significantly changed according to a temperature. Thus, it is desirable to perform temperature compensation. The apparent strain generated by the active gauges Rz1 and Rz3 is cancelled with the apparent strain generated by the dummy gauges Rz2 and Rz4, and hence the amount of strain is measured without the influence of the apparent strain. An output of the Z-axis displacement detection device having the structure as described above is expressed by the following expression.

$$e = KE\epsilon/2$$

The same output voltage as in Embodiment 1 using the two strain gauges is obtained. However, there is no influence of the apparent strain due to the temperature, with the result that the measurement precision is improved compared with Embodiment 1.

In order to detect a displacement in the Z-axis direction, each of four strain gauges is used as the active gauge. Two resistors are bonded parallel to the center axis and remaining two resistors are bonded along the circumference surface. Therefore, an output voltage "e" of approximately $1.6KE\epsilon/2$ is obtained and temperature compensation can be also performed. However, when the semiconductor used for the resistor in this embodiment is bonded to a curved surface, an accurate output is not obtained. Thus, such a bonding method can be applied to only the case of the resistor made of metal. When the resistor is made of semiconductor, it is effective to use the electrode for dummy gauge as in this embodiment.

The resistors for detecting a displacement of the piezoelectric element in the lateral direction are bonded to the band-shaped electrode portion 51a located on the surface side of the four-part electrode portions 53a, 54a, 55a, and 56a such that the two linear resistors 17 provided for each of the four-part electrode portions 53a, 54a, 55a, and 56a are parallel to the center axis. In this case, the four resistors (Rx1, Rx2, Rx3, and Rx4) in total which are bonded to the surface side of the opposed two electrodes 53a and 54a are connected in the bridge circuit illustrated in FIG. 4. In addition, the four resistors (Ry1, Ry2, Ry3, and Ry4) in total which are bonded to the surface side of the opposed two electrodes 55a and 56a are connected in the bridge circuit illustrated in FIG. 4. Even in this case, numbers attached to the resistors (strain gauges) illustrated in FIG. 9B correspond to the numbers of the resistors illustrated in FIG. 4. An output of the displacement detection device for each axis having the structure as described above is expressed by the following expression.

$$e = KE\epsilon$$

As is apparent from the expression, the output is two times that in the case where the two strain gauges serve as the bridge circuit in Embodiment 1, and hence high-sensitive measurement is performed. In addition to this, the apparent strains generated by the respective resistors can be cancelled to perform temperature compensation.

In this embodiment, each two of the stain gauges Rx1, Rx2, Rx3, Rx4, Ry1, Ry2, Ry3, and Ry4 bonded to the surface side of the four-part electrode portions 53a, 54a, 55a, and 56a are bonded in parallel. In the case of the cylindrical piezoelectric element, the same amount of strain in the longitudinal direction is obtained on the same electrode without depending on positions. Therefore, when it is difficult to arrange the electrodes in parallel because each of the electrodes has a small width, the two strain gauges bonded to each of the electrodes may be arranged in a straight line.

Embodiment 3

Figure 10A:
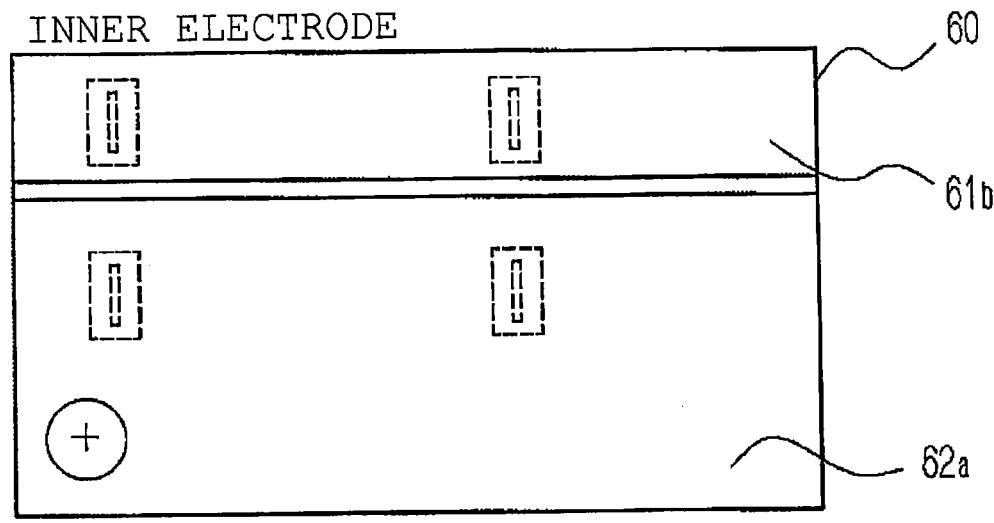
FIG. 10A is a developed view illustrating an inner surface of a cylindrical piezoelectric element according to Embodiment 3 of the present invention.
Figure 10B:
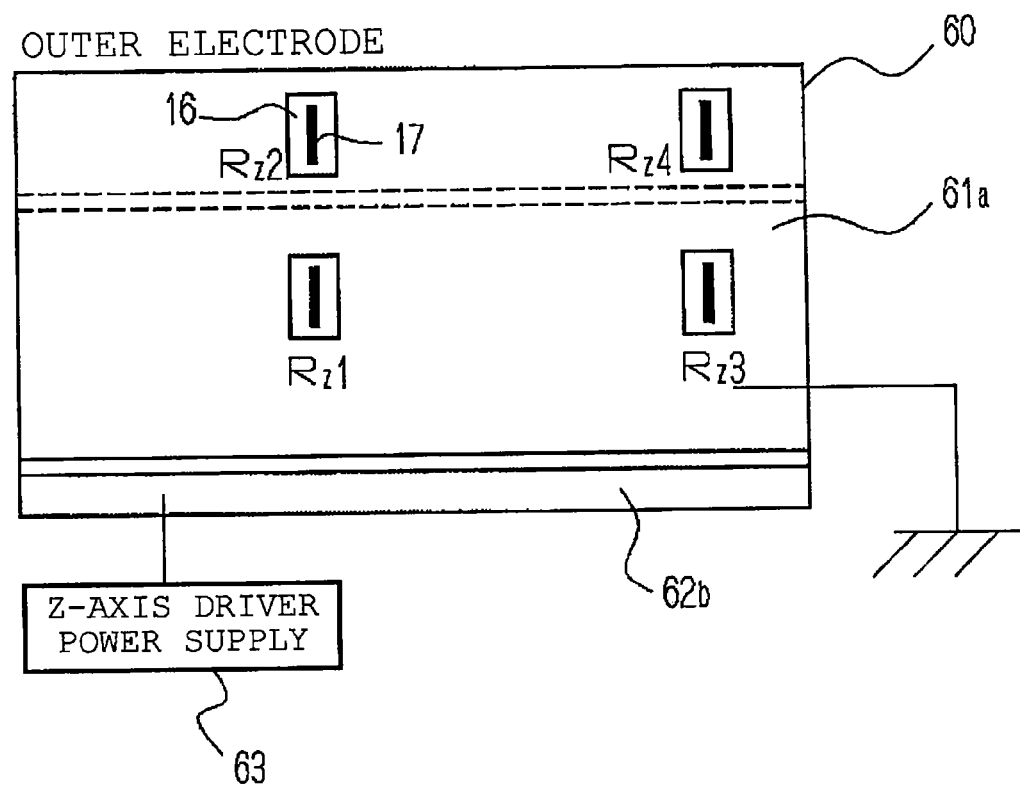
FIG. 10B is a developed view illustrating an outer surface of the cylindrical piezoelectric element according to Embodiment 3 of the present invention.

FIGS. 10A and 10B illustrate a piezoelectric element 60 of a cylindrical piezoelectric actuator with a displacement meter according to Embodiment 3 of the present invention. FIG.

10A is a developed view illustrating electrodes located on an inner surface of the cylindrical piezoelectric element. FIG. 10B is a developed view illustrating electrodes located on an outer surface of the cylindrical piezoelectric element. The driving direction of the piezoelectric element and the displacement detection method are identical to those in Embodiments 1 and 2, and hence only the structure is described and the description of the operation is omitted.

In this embodiment, the cylindrical piezoelectric actuator with a displacement meter is an actuator for generating displacement in the direction parallel to the center axis. Band-shaped electrode portions 61*b* and 62*a* obtained by division into two parts in the vertical direction are provided on the inner surface.

The band-shaped electrode portion 61*b* provided in the upper end portion of the inner surface is a folded electrode portion and connected with a band-shaped electrode portions 61*a* located on the outer surface. The band-shaped electrode portion 62*a* located on the inner surface is polarized to plus polarity.

The band-shaped electrode portion 61*a* is provided on the outer surface. A folded electrode portion 62*b* is provided in the lower end portion of the outer surface and is connected with the band-shaped electrode portion 62*a* located on the inner surface.

The band-shaped electrode portion 61*a* located on the outer surface is set at the ground potential. The band-shaped electrode portion 62*a* located on the inner surface is connected with a Z-axis driver power supply 63 through the folded electrode portion 62*b* located on the outer surface.

The folded electrode portion 61*b* acts as a dummy electrode. The two strain gauges Rz2 and Rz4 are bonded to the band-shaped electrode portion 61*a* located on the outer surface (surface side). The two strain gauges Rz2 and Rz4 act as dummy gauges for temperature compensation. The band-shaped electrode portion 62*a* located on the inner surface acts as an active electrode. The two strain gauges Rz1 and Rz3 are bonded to the band-shaped electrode portion 61*a* located on the outer surface (surface side). The two strain gauges Rz1 and Rz3 act as active gauges.

The four strain gauges Rz1, Rz2, Rz3, and Rz4 are connected in the bridge circuit illustrated in FIG. 4 to serve as a displacement detection device. An output "e" (=KE∈/2) is obtained from the displacement detection device and temperature compensation is also performed.

Embodiment 4

Figure 11A:
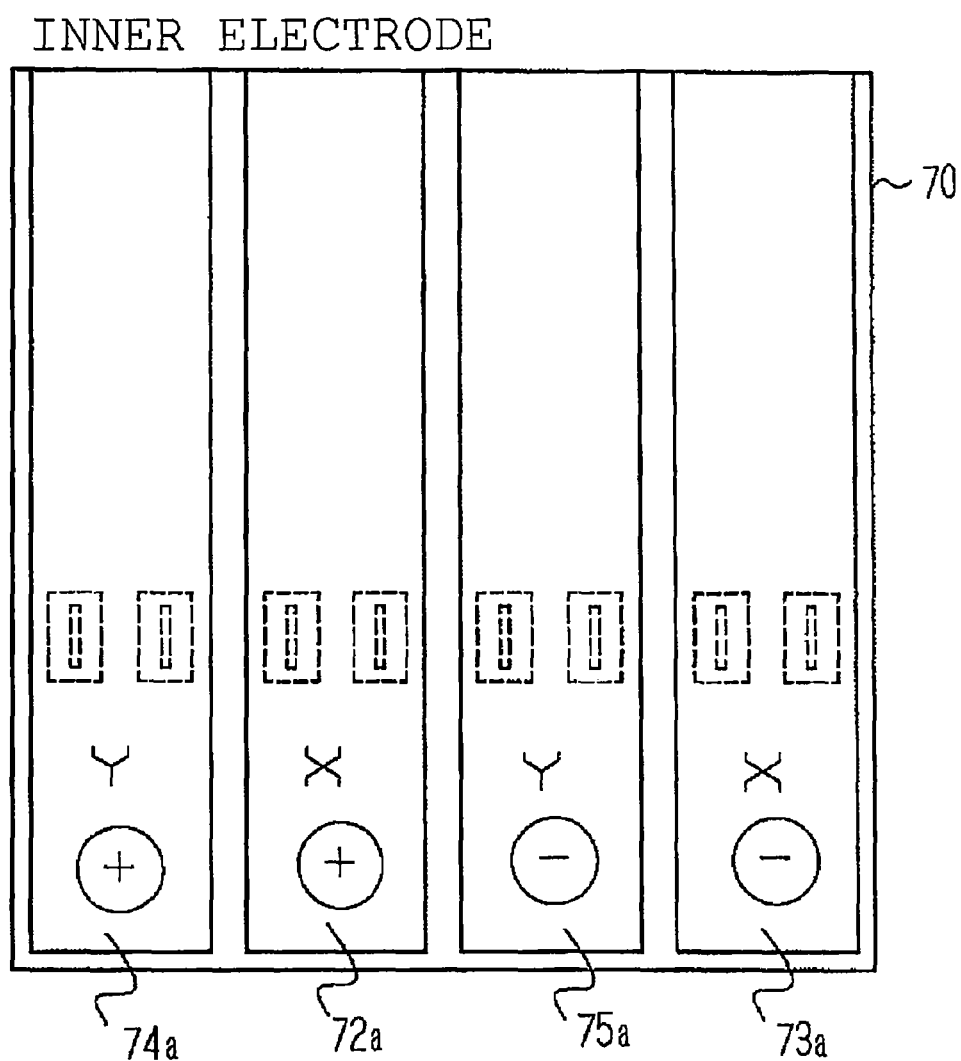
FIG. 11A is a developed view illustrating an inner surface of a cylindrical piezoelectric element according to Embodiment 4 of the present invention.
Figure 11B:
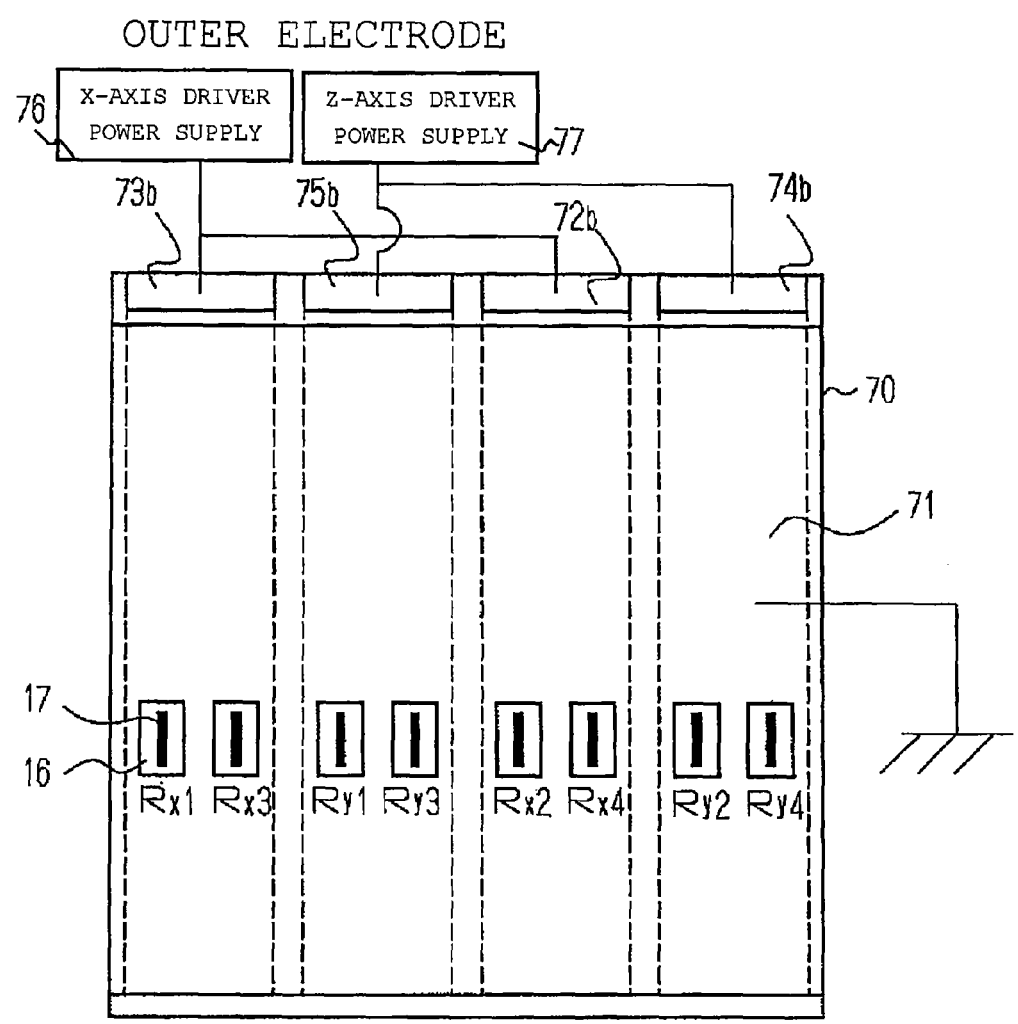
FIG. 11B is a developed view illustrating an outer surface of the cylindrical piezoelectric element according to Embodiment 4 of the present invention.

FIGS. 11A and 11B illustrate a piezoelectric element 70 of a cylindrical piezoelectric actuator with a displacement meter according to Embodiment 4 of the present invention. FIG. 11A is a developed view illustrating electrodes located on an inner surface of the cylindrical piezoelectric element. FIG. 11B is a developed view illustrating electrodes located on an outer surface of the cylindrical piezoelectric element.

In this embodiment, the cylindrical piezoelectric actuator with a displacement meter is an actuator driven within a two-dimensional plane perpendicular to the center axis. Four-part electrode portions 72*a*, 73*a*, 74*a*, and 75*a* which are obtained by division into four parts along the circumference and formed in the direction parallel to the center axis are provided on the inner surface. The respective four-part electrode portions are polarized so that the electrode portions 72*a* and 73*a* which are opposed to each other about the center axis are reversed in polarity to each other, and the electrode portions 74*a* and 75*a* which are opposed to each other about the center axis are reversed in polarity to each other. Folded electrode portions 72*b*, 73*b*, 74*b*, and 75*b* connected with the four-part electrode portions 72*a*, 73*a*, 74*a*, and 75*a* located on the inner surface are provided on the outer surface. A band-shaped electrode portion 71 is provided on the outer surface.

Among the four-part electrode portions 72*a*, 73*a*, 74*a*, and 75*a*, the two electrode portions 72*a* and 73*a* opposed to each other about the center axis are connected with an X-axis driver power supply 76 through the folded electrode portions 72*b* and 73*b* located on the outer surface, and the two electrode portions 74*a* and 75*a* opposed to each other about the center axis are connected with a Y-axis driver power supply 77 through the folded electrode portions 74*b* and 75*b* located on the outer surface. The band-shaped electrode portion 71 located on the outer surface is set at the ground potential.

A part of the band-shaped electrode portion 71 (outer surface) which is located on the rear side of each of the four-part electrode portions 72*a*, 73*a*, 74*a*, and 75*a* is bonded with corresponding two strain gauges Rx2 and Rx4 (Rx1 and Rx3; Ry2 and Ry4; and Ry1 and Ry3). The four strain gauges Rx1, Rx2, Rx3, and Rx4 (Ry1, Ry2, Ry3, and Ry4) for X-axis (Y-axis) in total which are bonded to the two electrodes opposed to each other about the center axis are connected in the bridge circuit illustrated in FIG. 4, thereby serving as the displacement detection device for X-axis (Y-axis). Therefore, displacements in the two-axis direction are detected.

Embodiment 5

Figure 12A:
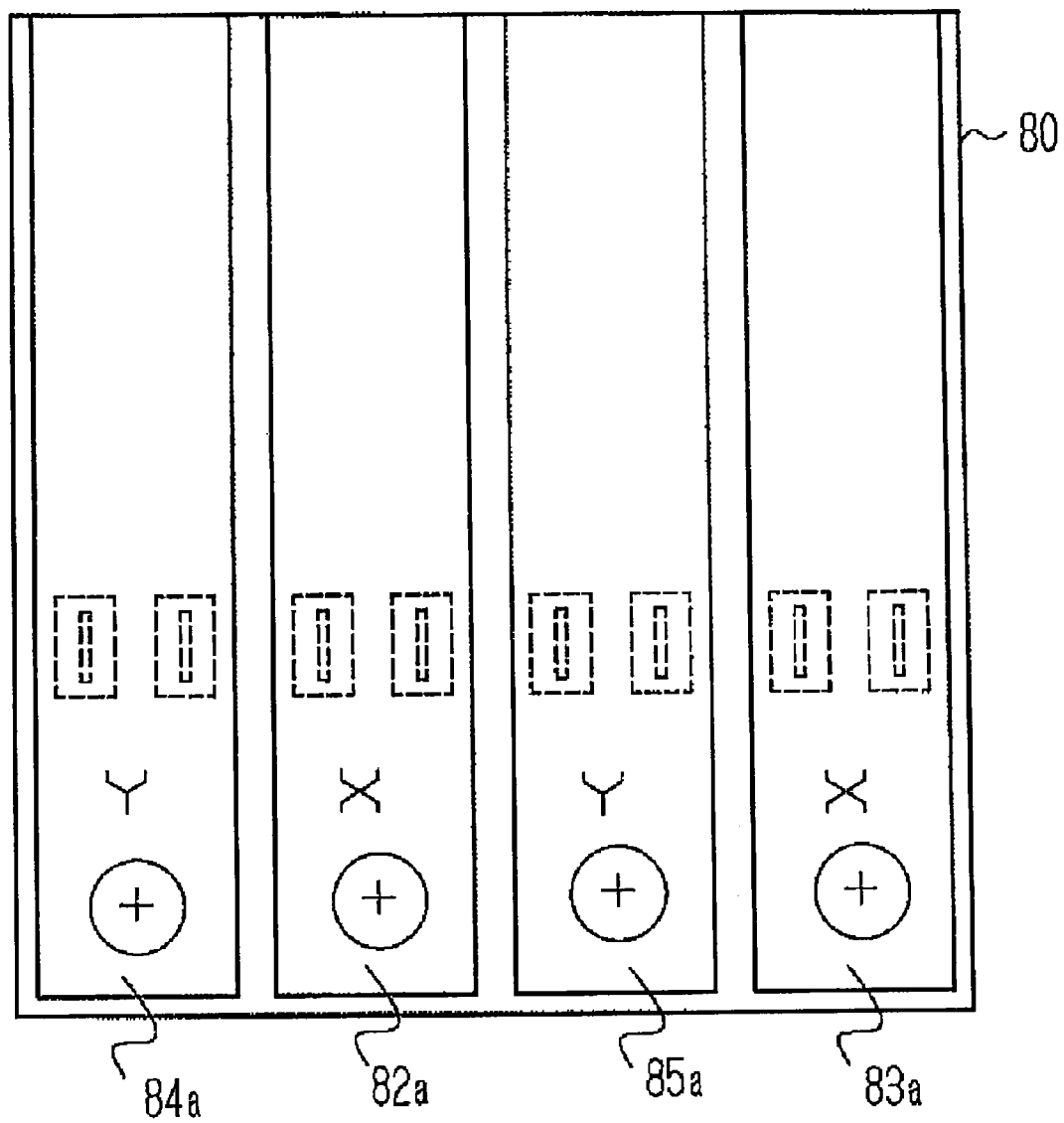
FIG. 12A is a developed view illustrating an inner surface of a cylindrical piezoelectric element according to Embodiment 5 of the present invention.
Figure 12B:
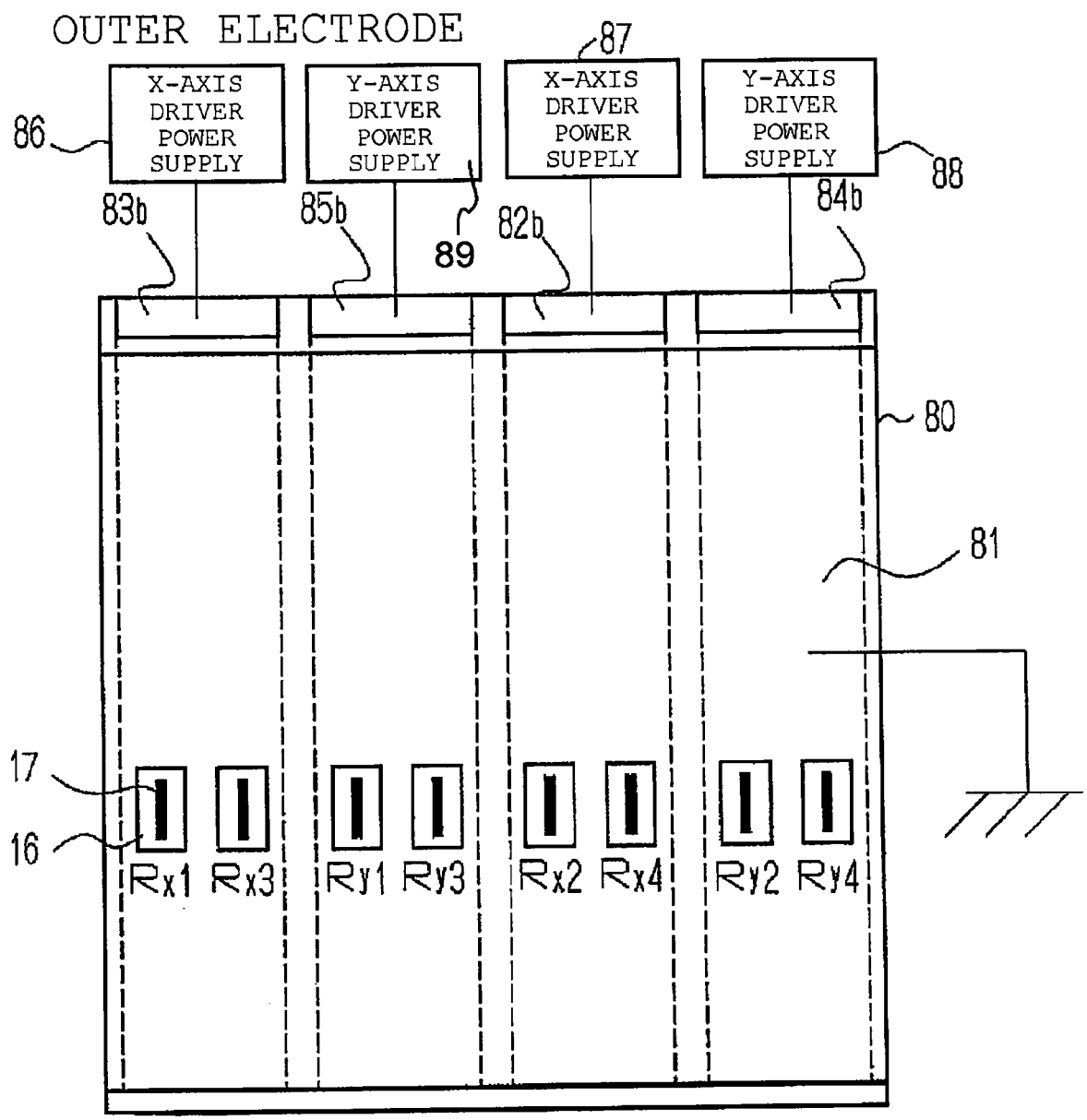
FIG. 12B is a developed view illustrating an outer surface of the cylindrical piezoelectric element according to Embodiment 5 of the present invention.

FIGS. 12A and 12B illustrate a piezoelectric element 80 of a cylindrical piezoelectric actuator with a displacement meter according to Embodiment 5 of the present invention. FIG. 12A is a developed view illustrating electrodes located on an inner surface of the cylindrical piezoelectric element. FIG. 12B is a developed view illustrating electrodes located on an outer surface of the cylindrical piezoelectric element.

In this embodiment, the cylindrical piezoelectric actuator with a displacement meter is an actuator driven within a two-dimensional plane perpendicular to the center axis. Four-part electrode portions 82*a*, 83*a*, 84*a*, and 85*a* which are obtained by division into four parts along the circumference and formed in the direction parallel to the center axis are provided on the inner surface. The respective four-part electrode portions are polarized so that the four-part electrode portions act as plus electrodes and have the same polarity. Folded electrode portions 82*b*, 83*b*, 84*b*, and 85*b* connected with the four-part electrode portions 82*a*, 83*a*, 84*a*, and 85*a* located on the inner surface are provided on the outer surface. A band-shaped electrode portion 81 is provided on the outer surface.

The four-part electrode portions 82*a*, 83*a*, 84*a*, and 85*a* are connected in an alternative order with X-axis driver power supplies 86 and 87 and Y-axis driver power supplies 88 and 89 through the folded electrode portions 82*b*, 83*b*, 84*b*, and 85*b* located on the outer surface. The band-shaped electrode portion 71 located on the outer surface is set at the ground potential.

In this embodiment, the two power supplies 86 and 87 (88 and 89) are used for X-axis (Y-axis). Voltages whose phases are reversed to each other are applied to generate bending about the center axis, thereby driving the tip portion within the two-dimensional plane.

A part of the band-shaped electrode portion 81 (outer surface) which is located on the rear side of each of the respective electrode portions 82*a*, 83*a*, 84*a*, and 85*a* is bonded with corresponding two strain gauges Rx2 and Rx4 (Rx1 and Rx3; Ry2 and Ry4; and Ry1 and Ry3). The four strain gauges Rx1, Rx2, Rx3, and Rx4 (Ry1, Ry2, Ry3, and Ry4) for X-axis (Y-axis) in total which are bonded to the two electrodes opposed to each other about the center axis are connected in the bridge circuit illustrated in FIG. 4, thereby serving as the displacement detection device for X-axis (Y-axis). Therefore, displacements in the two-axis direction are detected.

Embodiment 6

Figure 13A:
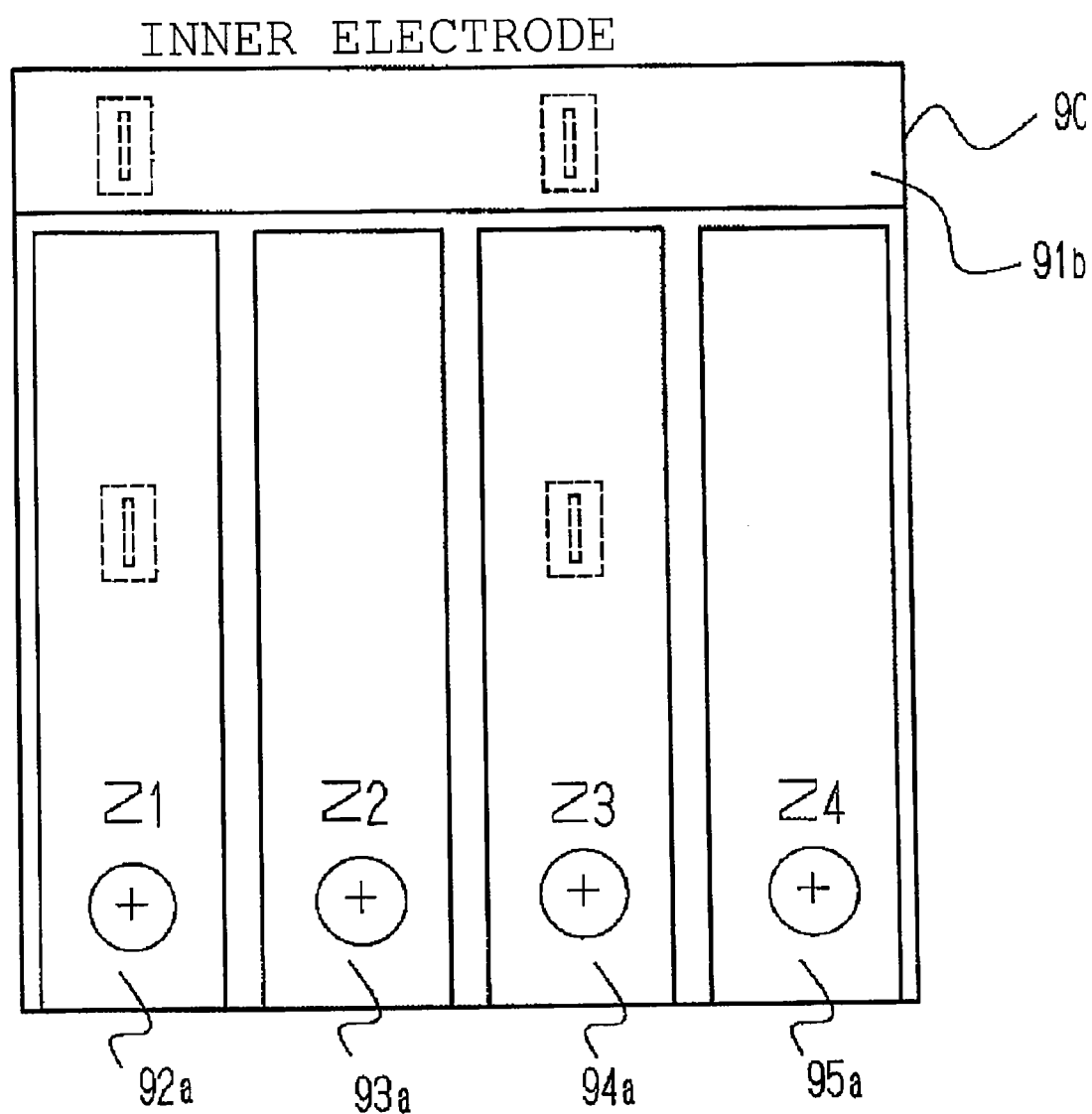
FIG. 13A is a developed view illustrating an inner surface of a cylindrical piezoelectric element according to Embodiment 6 of the present invention.
Figure 13B:
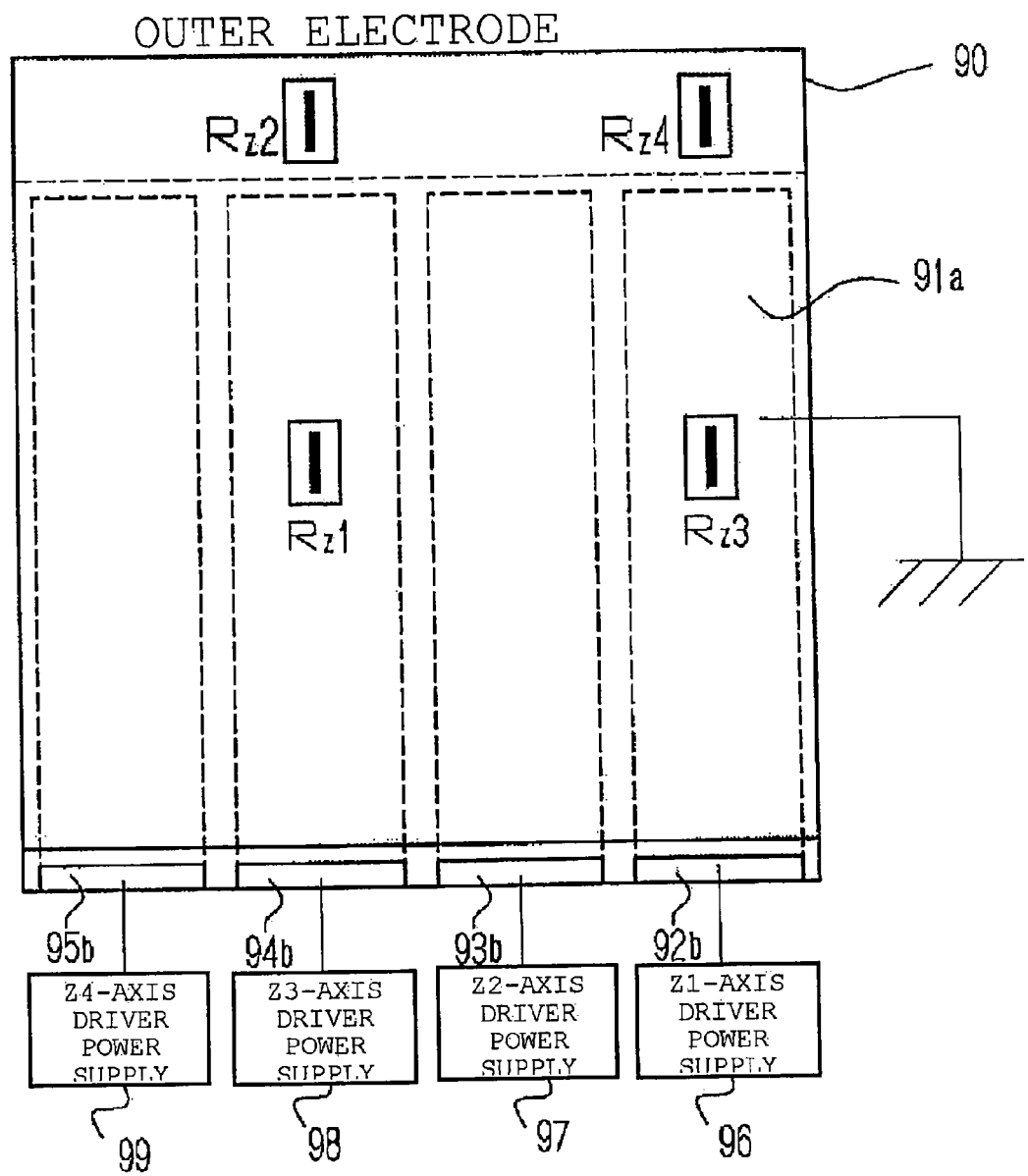
FIG. 13B is a developed view illustrating an outer surface of the cylindrical piezoelectric element according to Embodiment 6 of the present invention.

FIGS. 13A and 13B illustrate a piezoelectric element 90 of a cylindrical piezoelectric actuator with a displacement meter according to Embodiment 6 of the present invention. FIG. 13A is a developed view illustrating electrodes located on an inner surface of the cylindrical piezoelectric element. FIG. 13B is a developed view illustrating electrodes located on an outer surface of the cylindrical piezoelectric element.

In this embodiment, the cylindrical piezoelectric actuator with a displacement meter is an actuator for generating displacement in the direction parallel to the center axis. A band-shaped folded electrode portion 91b connected with a band-shaped electrode portion 91a located on the outer surface is provided in the upper end portion of the inner surface. Four-part electrode portions 92a, 93a, 94a, and 95a which are obtained by division into four parts along the circumference and formed in the direction parallel to the center axis are provided on the lower side of the inner surface. The respective four-part electrode portions 92a, 93a, 94a, and 95a are polarized so that the four-part electrode portions act as plus electrodes and have the same polarity. Folded electrode portions 92b, 93b, 94b, and 95b connected with the four-part electrode portions 92a, 93a, 94a, and 95a located on the inner surface are provided on the outer surface. A band-shaped electrode portion 91a is provided on the outer surface.

The four-part electrode portions 92a, 93a, 94a, and 95a are connected with corresponding Z-axis driver power supplies 96, 97, 98, and 99 through the folded electrode portions 92b, 93b, 94b, and 95b located on the outer surface. The band-shaped electrode portion 91a located on the outer surface is set to have the ground potential.

In this embodiment, voltages equal to one another in polarity and magnitude are applied from the Z-axis driver power supplies 96, 97, 98, and 99 connected with the four-part electrode portions 92a, 93a, 94a, and 95a. The piezoelectric element including the respective four-part electrode portions 92a, 93a, 94a, and 95a causes strains in the same direction, and thus the piezoelectric element 90 can be driven in the direction parallel to the center axis. Even when the same voltage is applied, in some cases, the piezoelectric actuator does not operate in the direction completely parallel to the center axis because of, for example, processing precision of the piezoelectric elements. In such a case, the voltages applied to the four-part electrode portions 92a, 93a, 94a, and 95a can be adjusted to correct a deviation, with the result that straight-line displacement is ensured.

In this embodiment, the two strain gauges Rz1 and Rz3 are bonded to the band-shaped electrode portion 91a (outer surface) located on the surface side of the respective four-part electrode portions 92a, 93a, 94a, and 95a acting as active electrodes, to thereby be served as active gauges. The two strain gauges Rz2 and Rz4 are bonded onto the band-shaped electrode portion 91a (outer surface) located on the surface side of the folded electrode portion 91b which acts as a dummy electrode and is located on the inner surface, to thereby be used as dummy gauges for temperature compensation. The four strain gauges Rz1, Rz2, Rz3, and Rz4 are connected in the bridge circuit illustrated in FIG. 4 to form a displacement detection device, whereby a displacement in the direction parallel to the center axis is detected.

An example of a split electrode manufacturing method is described with reference to FIGS. 13A, 13B, 14A, and 14B. In this embodiment, electrode division is performed using two methods.

In the first method, electrodes are formed on the inner surface, the outer surface, and both end surfaces, and then the electrodes are removed by processing for division.

In order to form the electrodes, a piezoelectric material is molded into a cylinder shape and then is degreased and cleaned, and palladium acting as a catalyst is adsorbed onto the entire surface of an element and then dried. Next, the element is immersed in a plating solution to be subjected to electroless nickel plating, thereby providing a nickel layer having a thickness of approximately 3 µm on the entire surface.

A part of a surface of the nickel layer and a part of a surface of the piezoelectric material which are located on the inner surface and the outer surface, respectively, are removed with a diamond-coated tool, to thereby form split electrodes. Outer electrodes can be relatively easily divided. Therefore, when split electrodes located only on the outer surface are formed using a masking tape during a plating process, a working time is shortened.

In the second method, a portion not provided with electrodes is masked for division.

In this method, a piezoelectric material is molded into a cylinder shape, and then is degreased and cleaned. After that, a resist solution is applied along divisional lines and dried to form a resist. Next, palladium is adsorbed and dried, and the resist is removed. The resultant piezoelectric material is immersed in a plating solution, and only a portion to which palladium is adsorbed is selectively subjected to electroless nickel plating, thereby forming split electrodes.

Note that the process order for division can be changed. For example, there can be used a method of performing palladium adsorption, resist application, electroless nickel plating, and resist removal in this order or a method of performing resist application, palladium adsorption, electroless nickel plating, and resist removal in this order.

A kind of mask is not limited to the resist. For example, a masking tape or another masking method can be used.

A material of the electrodes is not limited to nickel. An arbitrary conductive material such as silver, gold, or carbon can be used.

The manufacturing methods can be applied to the other embodiments of the present invention.

With respect to the piezoelectric elements used in Embodiments 3 and 6, the piezoelectric element including the active electrode and the piezoelectric element including the dummy electrode may be separately formed and bonded to each other by a connection member made of ceramics. In this case, a process for dividing the inner surface can be omitted, and hence manufacturing is easier than in the case of integral formation.

In the piezoelectric elements described in Embodiments 1 to 6, the electrode which is located on the outer surface and set at the ground potential is the uniform band-shaped electrode. However, the electrodes which are located on the outer surface and provided with the resistors may be divided and connected with, for example, a copper wire to have the same potential, thereby being set at the ground potential.

Embodiment 7

Figure 14A:
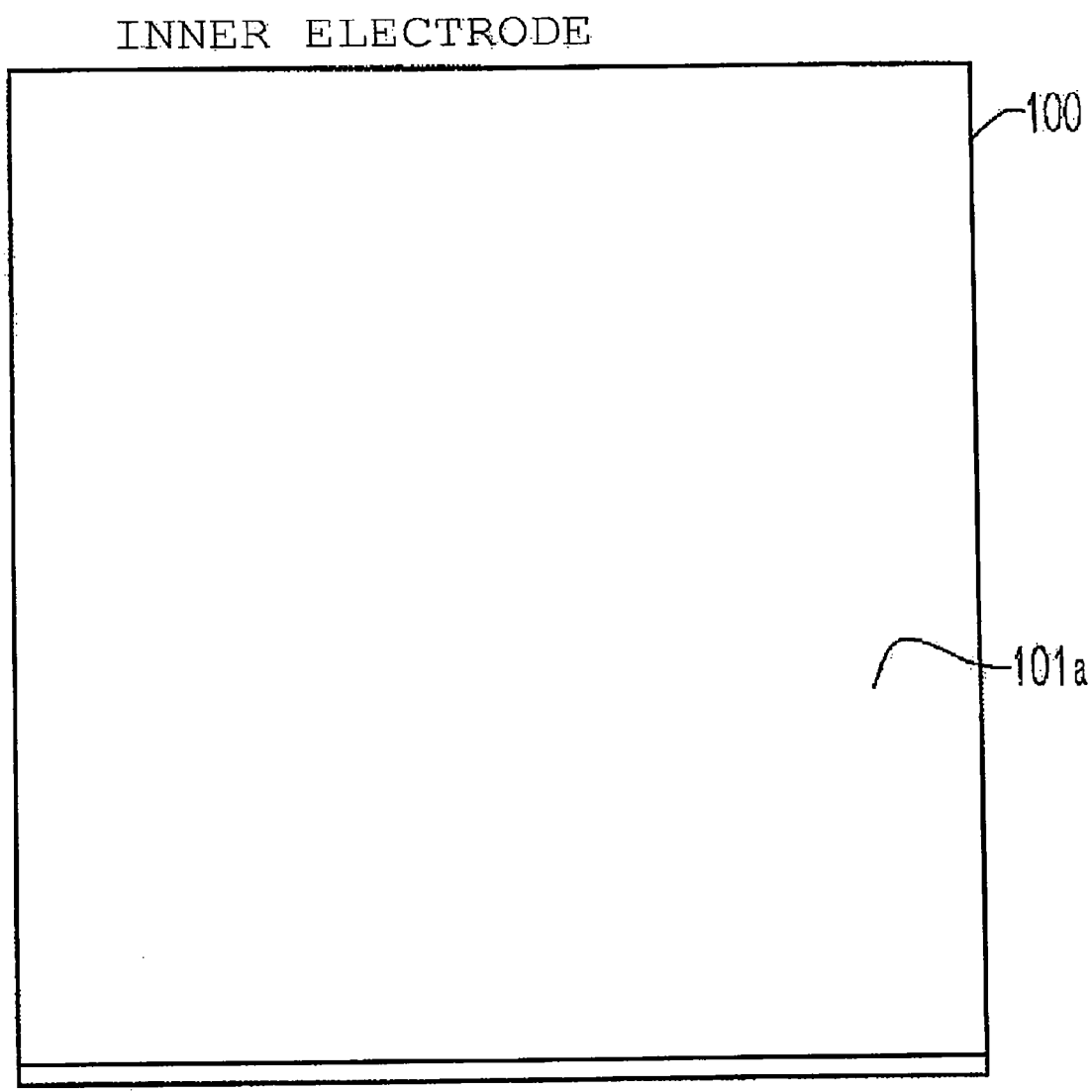
FIG. 14A is a developed view illustrating an inner surface of a cylindrical piezoelectric element according to Embodiment 7 of the present invention.
Figure 14B:
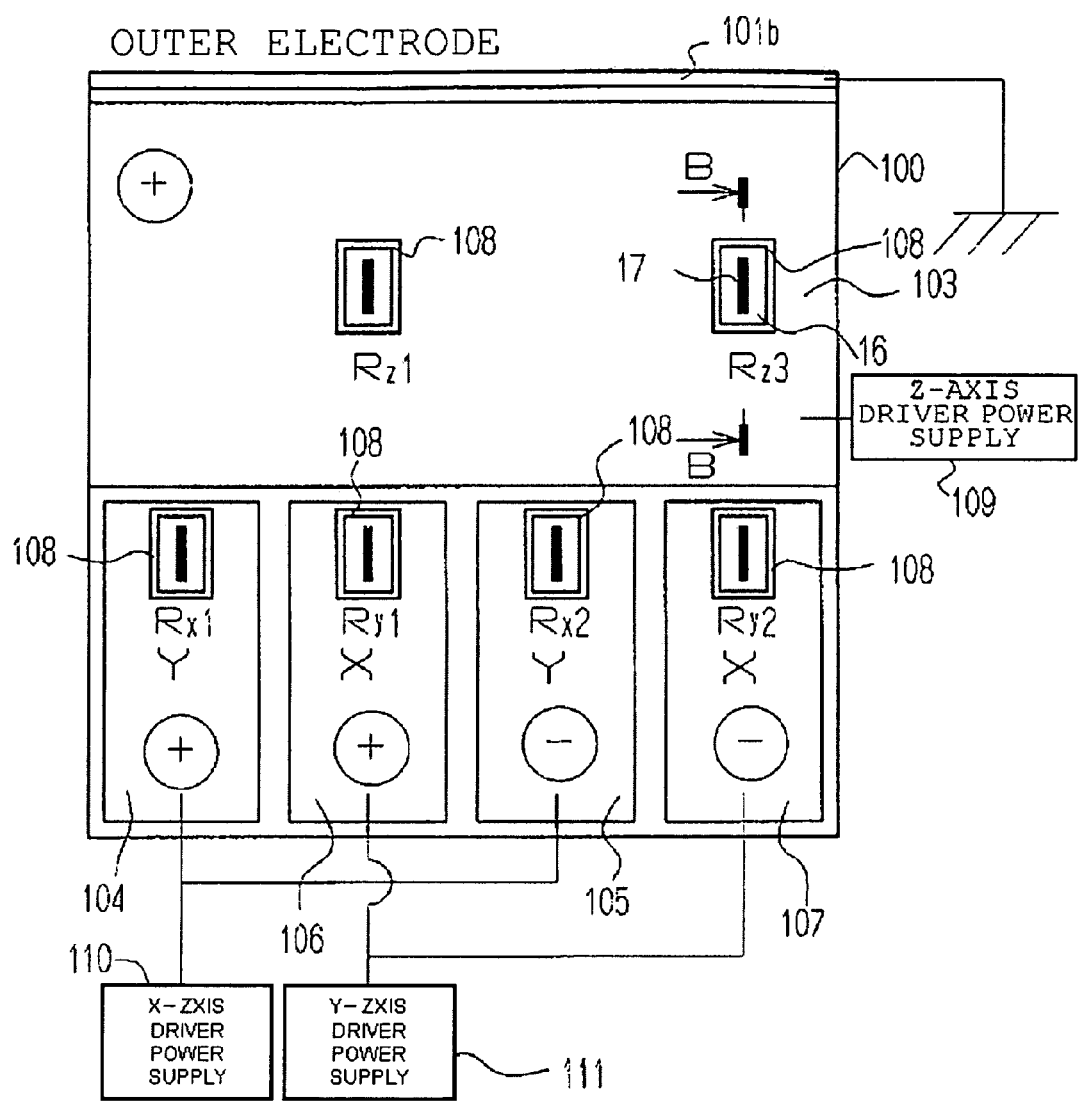
FIG. 14B is a developed view illustrating an outer surface of the cylindrical piezoelectric element according to Embodiment 7 of the present invention.
Figure 15:
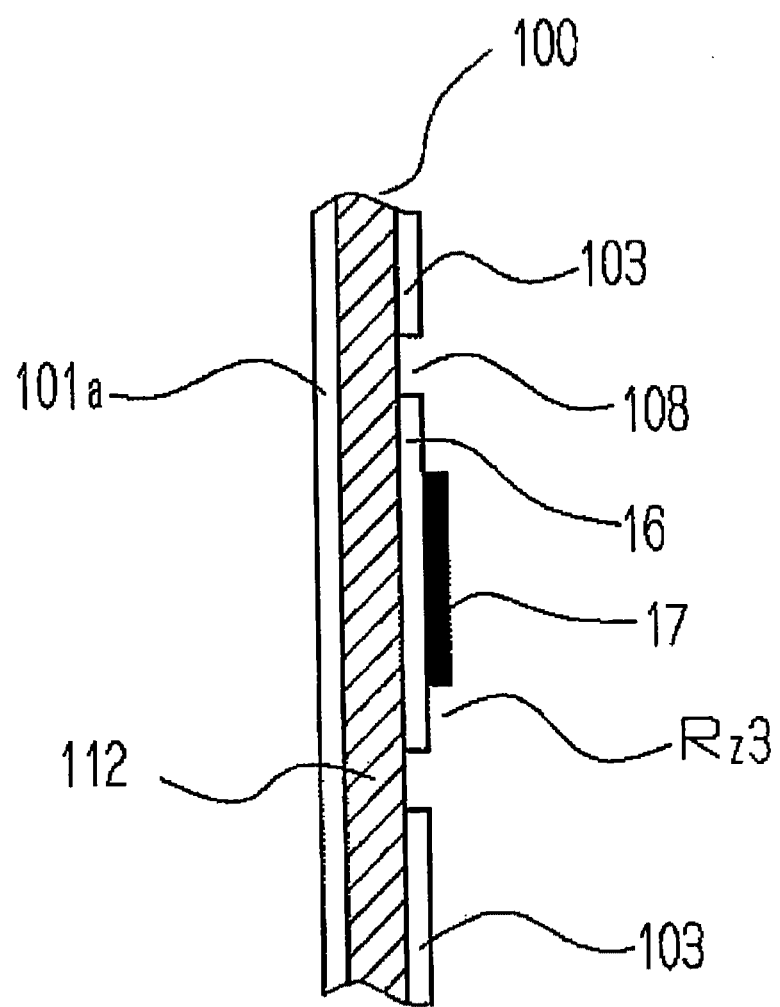
FIG. 15 is a cross-sectional view taken along a B-B line of FIG. 14B.

FIGS. 14A and 14B and FIG. 15 illustrate a piezoelectric element 100 of a cylindrical piezoelectric actuator with a displacement meter according to Embodiment 7 of the present invention. FIG. 14A is a developed view illustrating electrodes located on an inner surface of the cylindrical piezoelectric element. FIG. 14B is a developed view illustrating electrodes located on an outer surface of the cylindrical piezoelectric element. FIG. 15 is a cross-sectional view taken along a B-B line, illustrating a strain gauge attachment portion illustrated in FIG. 14B.

As illustrated in FIG. 14A, a single band-shaped electrode portion 101a is provided on the inner surface. As illustrated in FIG. 14B, the outer surface includes a folded electrode portion 101b connected with the band-shaped electrode portion 101a located on the inner surface, a band-shaped electrode portion 103, and four-part electrode portions 104, 105, 106, and 107. The band-shaped electrode portion 103 located on the outer surface is polarized to plus polarity. The four-part electrode portions 104, 105, 106, and 107 are polarized so that the electrode portions 104 and 105 which are opposed to each other about the center axis are reversed in polarity to each other, and the electrode portions 106 and 107 which are opposed to each other about the center axis are reversed in polarity to each other.

The band-shaped electrode portion 101a located on the inner surface is connected with ground through the folded electrode portion 101b located on the outer surface. The band-shaped electrode portion 103 located on the outer surface is connected with a Z-axis driver power supply 109. Among the four-part electrode portions 104, 105, 106, and 107, the two electrode portions 104 and 105 which are opposed to each other about the center axis are connected with an X-axis driver power supply 110 and the two electrode portions 106 and 107 which are opposed to each other about the center axis are connected with a Y-axis driver power supply 111.

In this embodiment, as illustrated in FIGS. 14B and 15, the band-shaped electrode portion 103 located on the outer surface includes two regions 108 in which no electrodes are provided, and each of the four-part electrode portions 104, 105, 106, and 107 includes a region 108 in which no electrode is provided. The strain gauges Rz1, Rz3, Rx1, Rx2, Ry1, and Ry2 are directly bonded to a piezoelectric element 112. The specifications of the strain gauges and the bonding method are identical to those in Embodiment 1. The two strain gauges Rz1 and Rz3 (Rx1 and Rx2; Ry1 and Ry2) for Z-axis (X-axis; Y-axis) and two fixed resistors are incorporated into the bridge circuit illustrated in FIG. 4, thereby serving as the displacement detection device for Z-axis (X-axis; Y-axis).

As described above, when the strain gauges are directly bonded to the piezoelectric element, the electrode portions 103, 104, 105, 106, and 107 of the piezoelectric element are not located on a bonding surface side of the base material 16 of the strain gauge. Therefore, capacitances do not generate, and hence the detection signals of the strain gauges are not adversely influenced by the capacitances.

The split electrodes are manufactured on the outer surface in this embodiment, and hence manufacturing of the electrodes of the piezoelectric element is easier than in the case where the split electrodes are provided on the inner surface.

When the resistors are to be directly provided for the piezoelectric element as in this embodiment, the resistors are not necessarily provided through the insulating base material. The resistors may be directly bonded onto the piezoelectric element.

Embodiment 8

Figure 16A:
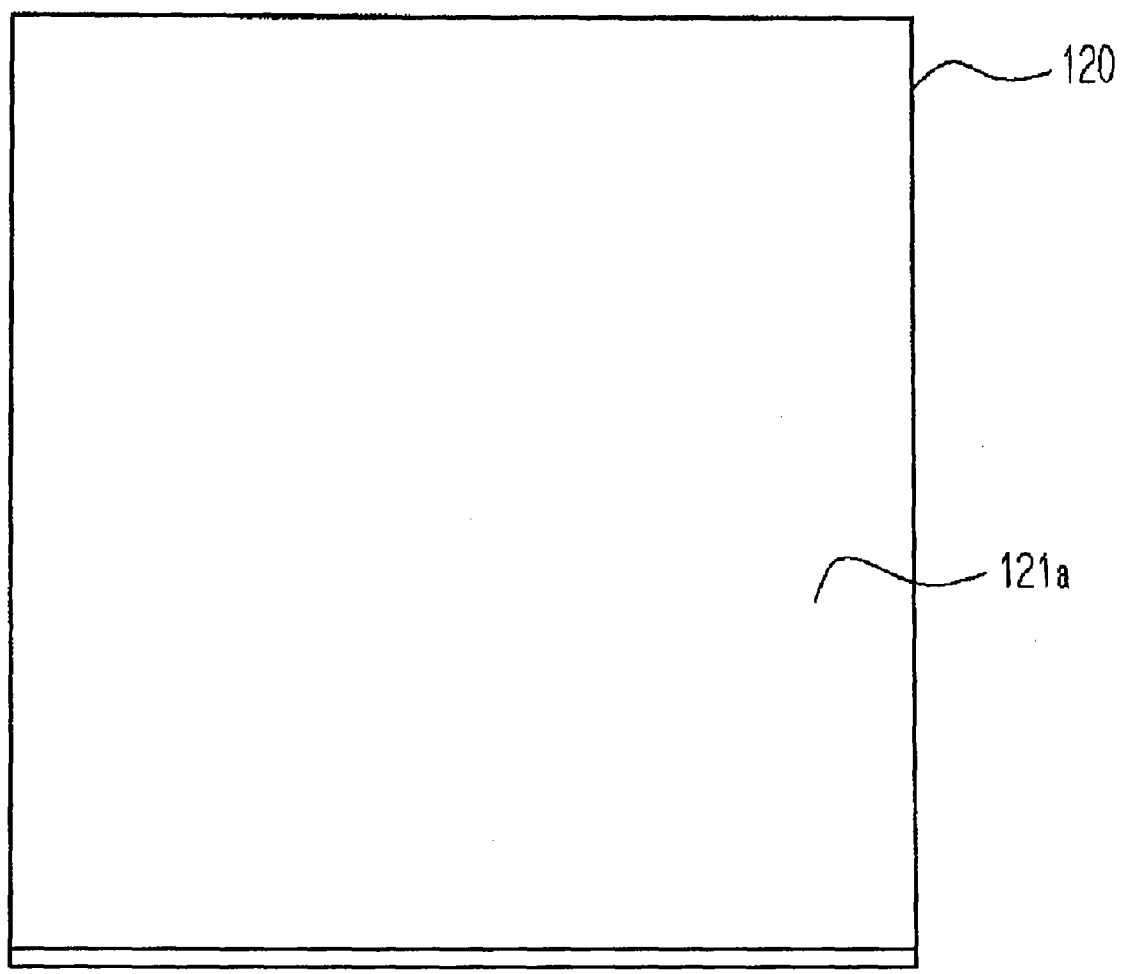
FIG. 16A is a developed view illustrating an inner surface of a cylindrical piezoelectric element according to Embodiment 8 of the present invention.
Figure 16B:
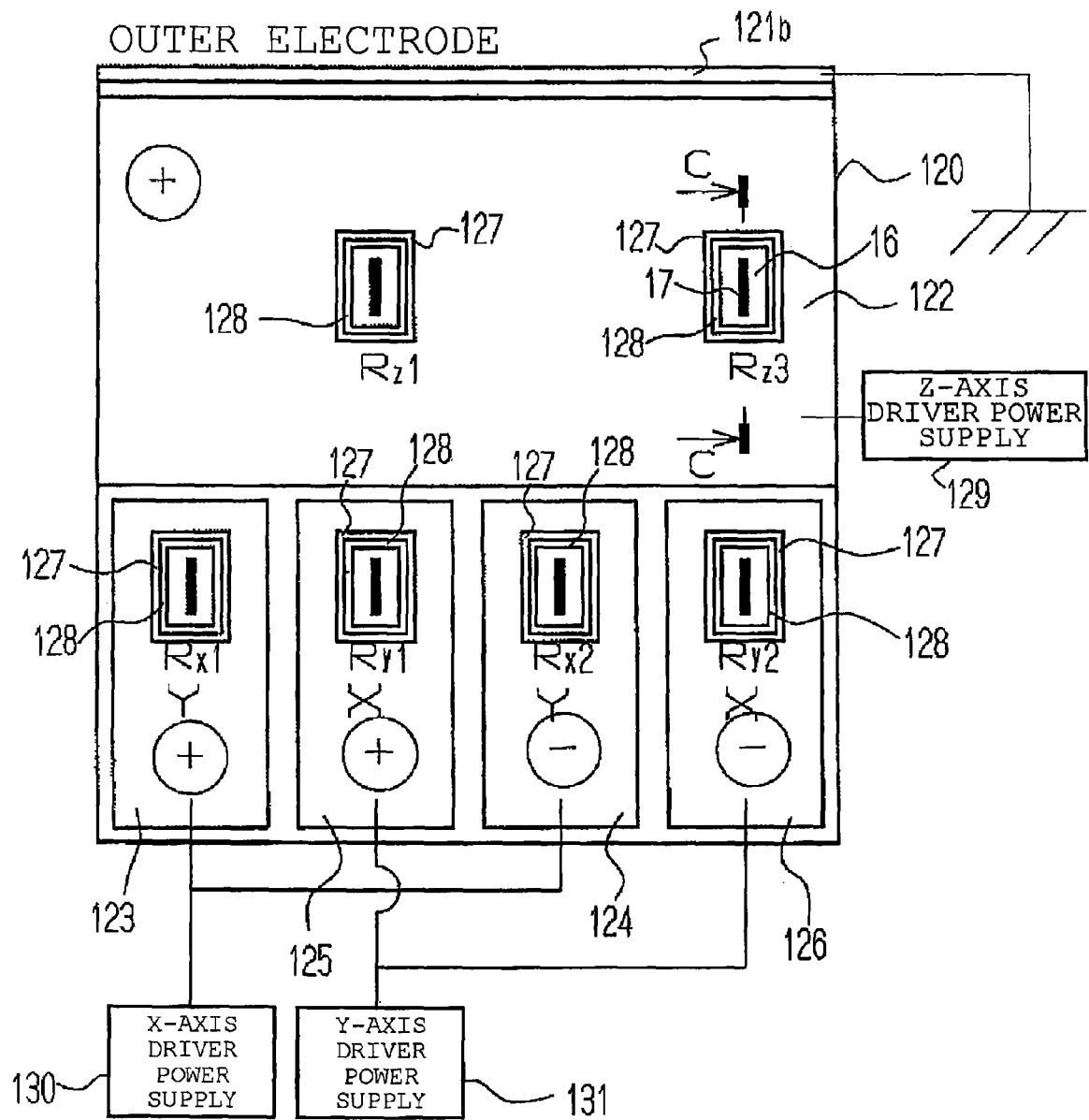
FIG. 16B is a developed view illustrating an outer surface of the cylindrical piezoelectric element according to Embodiment 8 of the present invention.
Figure 17:
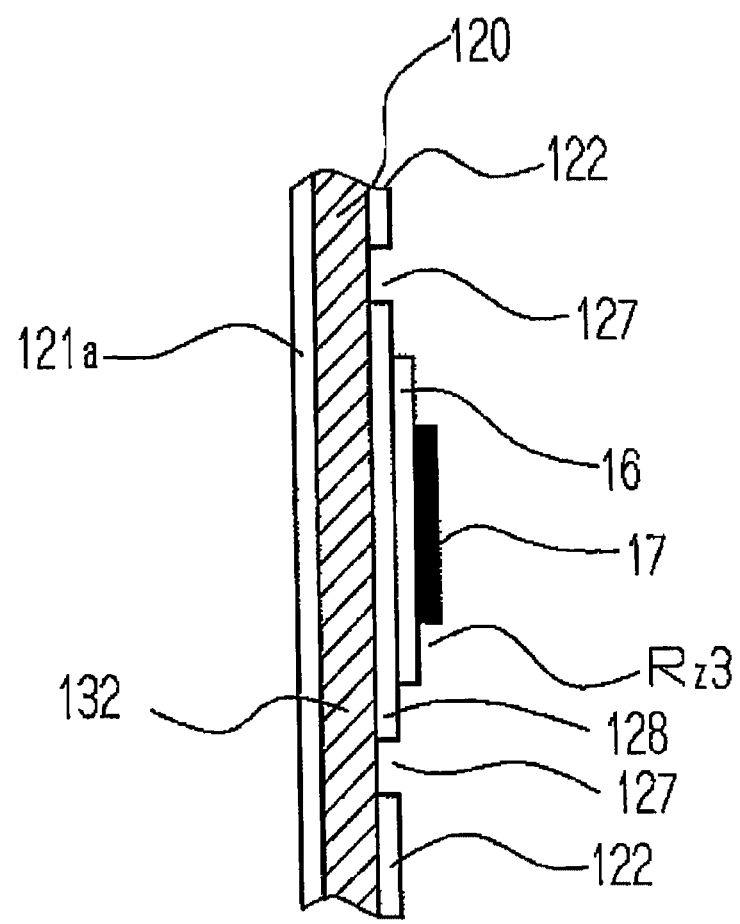
FIG. 17 is a cross-sectional view taken along a C-C line of FIG. 16B.

FIGS. 16A and 16B and FIG. 17 illustrate a cylindrical piezoelectric element 120 of a cylindrical piezoelectric actuator with a displacement meter according to Embodiment 8 of the present invention. FIG. 16A is a developed view illustrating electrodes located on an inner surface of the cylindrical piezoelectric element. FIG. 16B is a developed view illustrating electrodes located on an outer surface of the cylindrical piezoelectric element. FIG. 17 is a cross-sectional view taken along a C-C line, illustrating a strain gauge attachment portion illustrated in FIG. 16B.

As illustrated in FIG. 16A, a single band-shaped electrode portion 121a is provided on the inner surface. As illustrated in FIG. 16B, the outer surface includes a folded electrode portion 121b connected with the band-shaped electrode portion 121a located on the inner surface, a band-shaped electrode portion 122, and four-part electrode portions 123, 124, 125, and 126. The band-shaped electrode portion 122 located on the outer surface is polarized to plus polarity. The four-part electrode portions 123, 124, 125, and 126 are polarized so that the electrode portions 123 and 124 which are opposed to each other about the center axis are reversed in polarity to each other, and the electrode portions 125 and 126 which are opposed to each other about the center axis are reversed in polarity to each other.

The band-shaped electrode portion 121a located on the inner surface is connected with ground through the folded electrode portion 121b located on the outer surface. The band-shaped electrode portion 122 located on the outer surface is connected with a Z-axis driver power supply 129. Among the four-part electrode portions 123, 124, 125, and 126, the two electrode portions 123 and 124 which are opposed to each other about the center axis are connected with an X-axis driver power supply 130 and the two electrode portions 125 and 126 which are opposed to each other about the center axis are connected with a Y-axis driver power supply 131.

In this embodiment, as illustrated in FIGS. 16B and 17, the band-shaped electrode portion 122 located on the outer surface includes two strain gauge attachment electrodes 128 separated from the respective electrode portions, and each of the four-part electrode portions 123, 124, 125, and 126 includes a strain gauge attachment electrode 128 separated from the respective electrode portions. The strain gauges Rz1, Rz3, Rx1, Rx2, Ry1, and Ry2 are bonded onto the strain gauge attachment electrodes 128. The specifications of the strain gauges and the bonding method are identical to those in Embodiment 1. The two strain gauges Rz1 and Rz3 (Rx1 and Rx2; Ry1 and Ry2) for Z-axis (X-axis; Y-axis) and two fixed resistors are incorporated into the bridge circuit illustrated in FIG. 4, thereby serving as the displacement detection device for Z-axis (X-axis; Y-axis).

The strain gauge attachment electrodes 128 may be connected with ground, but in this embodiment, the strain gauge attachment electrodes 128 are set at a potential equal to a voltage applied to the resistor 17. In this manner, when the strain gauge attachment electrodes 128 are separated from the electrode portions 122, 123, 124, 125, and 126 connected with the driver power supplies 129, 130, and 131 for the piezoelectric element and the strain gauges Rz1, Rz3, Rx1, Rx2, Ry1, and Ry2 are bonded onto the strain gauge attachment electrodes 128, capacitances do not generate in the strain gauge bonding portions. Therefore, the detection signals of the strain gauges are not adversely influenced by the capacitances.

In this embodiment, the resistor 17 located on the base material 16 of the strain gauge or a resistor connection electrode (not shown) and the strain gauge attachment electrode 128 have the same potential. Therefore, the influence of capacitance can be further eliminated as compared with the case where the strain gauge attachment electrode 128 is connected with ground.

As described above, the method involving setting the potential of the strain gauge attachment electrode 128 equal to the voltage applied to the resistor, instead of the method involving connecting the electrode with ground, can be also applied to other embodiments of the present invention.

Embodiment 9

Figure 18:
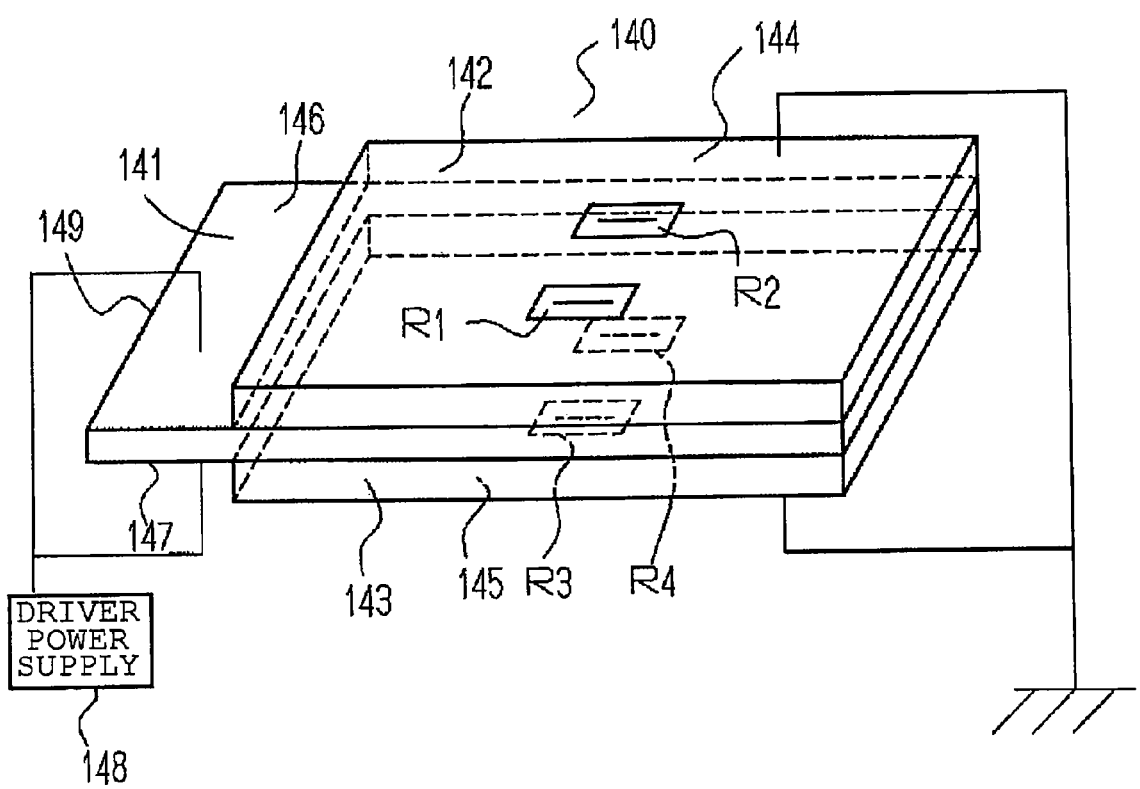
FIG. 18 is a schematic external view illustrating a bimorph piezoelectric actuator provided with a displacement meter according to Embodiment 9 of the present invention.

FIG. 18 illustrates a bimorph piezoelectric actuator 140 with a displacement meter according to Embodiment 9 of the present invention.

The bimorph piezoelectric actuator 140 is an actuator in which two plate-shaped piezoelectric elements 142 and 143, which are polarized to generate strains reversed to each other in the longitudinal direction, are bonded to both surfaces of a plate-shaped elastic member 141 made of an elastic material such as phosphor bronze, and the strains are generated by the piezoelectric elements 142 and 143 to generate bending deformation about a support point 149. The piezoelectric elements 142 and 143 located on upper and lower surfaces include electrodes 144, 145, 146, and 147 located on surface sides and elastic material bonding sides.

In this embodiment, in order to be able to measure strain in the long-axis direction, two strain gauges R1 and R2 and two strain gauges R3 and R4 are bonded to the surface side electrodes 144 and 145 of the piezoelectric elements 142 and 143 bonded to the upper and lower surfaces of the elastic member 141. The four strain gauges R1, R2, R3, and R4 in total are incorporated into the bridge circuit to detect a displacement in a bending direction.

Each of the strain gauges R1, R2, R3, and R4 used in this embodiment is a strain gauge in which a metal resistor made of a copper-nickel alloy is formed by patterning a resistor on a base material made of an insulator which has a thickness of 15 μm and contains a phenol resin and an epoxy resin which are mixed with each other. A resistance value is 120Ω and a gauge factor is 2.

In this embodiment, the electrodes 144 and 145 to which the strain gauges R1, R2, R3, and R4 are bonded are set at the ground potential, and the electrodes 146 and 147 located on the elastic material bonding surface side are connected with a driver power supply 148.

When such connection is employed, capacitances do not generate in the strain gauges R1, R2, R3, and R4. Therefore, a displacement detection signal can be detected without the influence of capacitor components, and hence detection precision is improved.

The piezoelectric element can be bonded to only one of both surfaces of the elastic member to provide a unimorph piezoelectric actuator.

Embodiment 10

Figure 19:
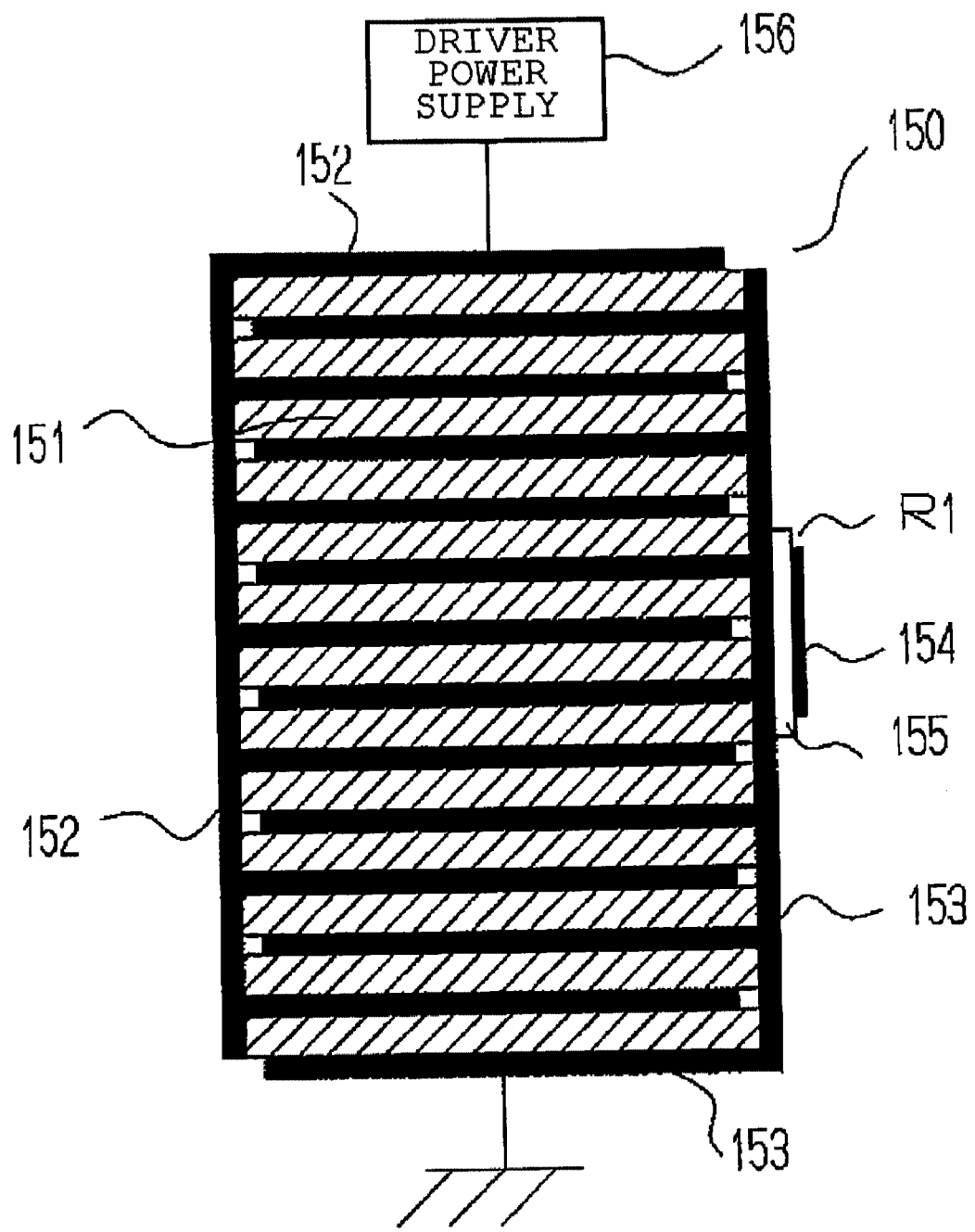
FIG. 19 is a schematic external view illustrating a stacked piezoelectric actuator provided with a displacement meter according to Embodiment 10 of the present invention.

FIG. 19 illustrates a stacked piezoelectric actuator 150 with a displacement meter according to Embodiment 10 of the present invention. The stacked piezoelectric actuator 150 is formed by alternately stacking film-shaped piezoelectric elements 151 polarized in a thickness direction and electrodes 152 and 153. The polarization polarities of film-shaped piezoelectric elements 151 which are adjacently arranged are reversed to each other. The electrodes located above and under the film-shaped piezoelectric element 151 are alternatively connected with the electrodes 152 and 153 provided on side surfaces of the stacked piezoelectric actuator 150. The electrode 153 provided on one of the side surfaces is connected with a ground electrode, and the electrode 152 provided on the other thereof is connected with a driver power supply 156.

The same strain gauge R1 as used in Embodiment 9, which includes a base material 155 and a resistor 154, is bonded to the electrode 153 connected with the ground electrode in order to be able to detect longitudinal strain. When the strain gauge R1 is connected with a displacement detection device, a displacement of the stacked piezoelectric actuator 150 can be detected.

In this embodiment, too, a capacitance does not generate in an attachment portion of the strain gauge R1 because the strain gauge R1 is connected with the ground electrode. Therefore, a displacement detection signal can be detected without being affected by a capacitor component, and hence detection precision is improved.

Embodiment 11

Figure 20:
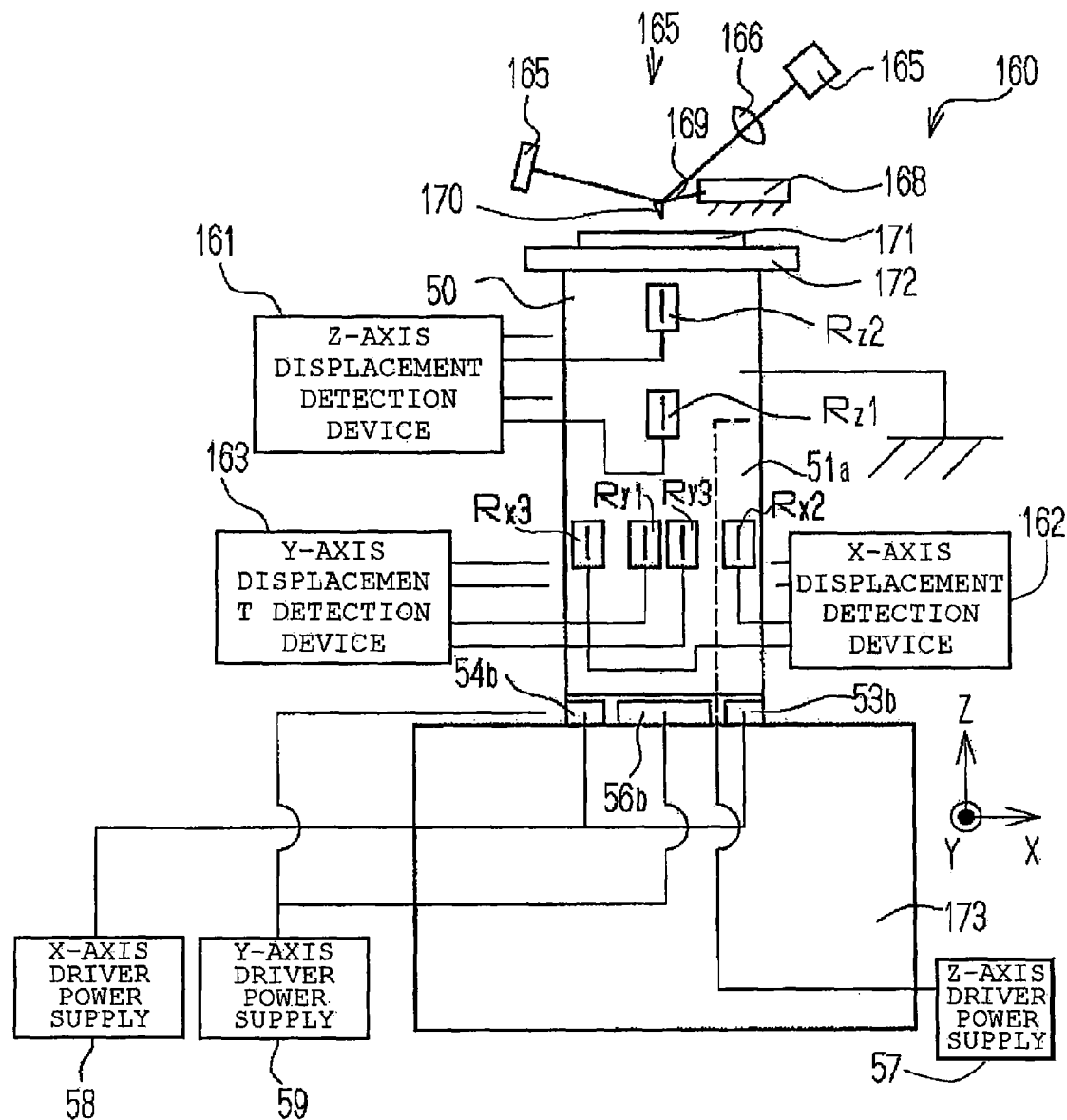
FIG. 20 is a schematic external view illustrating a scanning probe microscope using a cylindrical piezoelectric actuator provided with a displacement meter according to Embodiment 11 of the present invention.

FIG. 20 illustrates a structure of a scanning probe microscope 160 using the cylindrical piezoelectric actuator according to Embodiment 2, which is an example of a positioning device using a piezoelectric actuator provided with a displacement meter.

In this embodiment, the terminal end portion of the piezoelectric element 50 illustrated in FIGS. 9A and 9B is fixed to a base 173, and a sample holder 172 is fixed to the tip end portion thereof. In this manner, the piezoelectric actuator is used for a triaxial fine adjustment mechanism.

A sample 171 is placed on the sample holder 172. A cantilever 169 which has a probe 170 provided at the tip end and is held by a cantilever holder 168 is opposed to the sample 171.

A displacement of the cantilever 169 is measured by an optical lever type displacement detection mechanism 164 including a semiconductor laser 165, a condenser lens 166, and a photo detector 167.

In this embodiment, the probe 170 is brought close to the sample 171 in a region in which the interatomic force acts. Then, raster scanning is performed in a direction parallel to the in-plane of the sample using the four-part electrode portions 53a, 54a, 55a, and 56a of the piezoelectric element 50 with a displacement meter. At this time, feedback control in a direction perpendicular to the in-plane of the sample is performed using the band-shaped electrode portion 52 based on a signal from the displacement detection mechanism 164 such that a distance between the probe 170 and the sample 171 becomes constant.

In this case, the operation in X- and Y-directions is feedback-controlled such that displacements are linearly adjusted according to driving voltages applied from the X-axis driver power supply 58 and the Y-axis driver power supply 59 to the piezoelectric actuator 50 based on displacements measured by an X-axis displacement detection device 162 and a Y-axis displacement detection device 163 using the strain gauges Rx1, Rx2, Rx3, Rx4, Ry1 Ry2, Ry3, and Ry4 provided for the respective axes.

In the scanning probe microscope 160 having the structure described above, when the signals in the X- and Y-directions are imaged as two-dimensional plane information and the displacement signal detected by a Z-axis displacement detection device 161 using the strain gauges Rz1, Rz2, Rz3, and Rz4 attached for the Z-axis is imaged as height information, a three-dimensional uneven shape can be measured.

As to the Z-axis, in the case where the signal from the Z-axis displacement detection device 161 is imaged, even when the amount of movement in the Z-axis is not linearly adjusted according to the applied voltage, accurate height information measurement can be performed. When the feedback control is performed such that the amount of displacement is linearly adjusted according to the driving voltage for Z-axis, the voltage applied for the Z-axis from the Z-axis driver power supply 57 can be also displayed as the height information.

Embodiment 12

Figure 21:
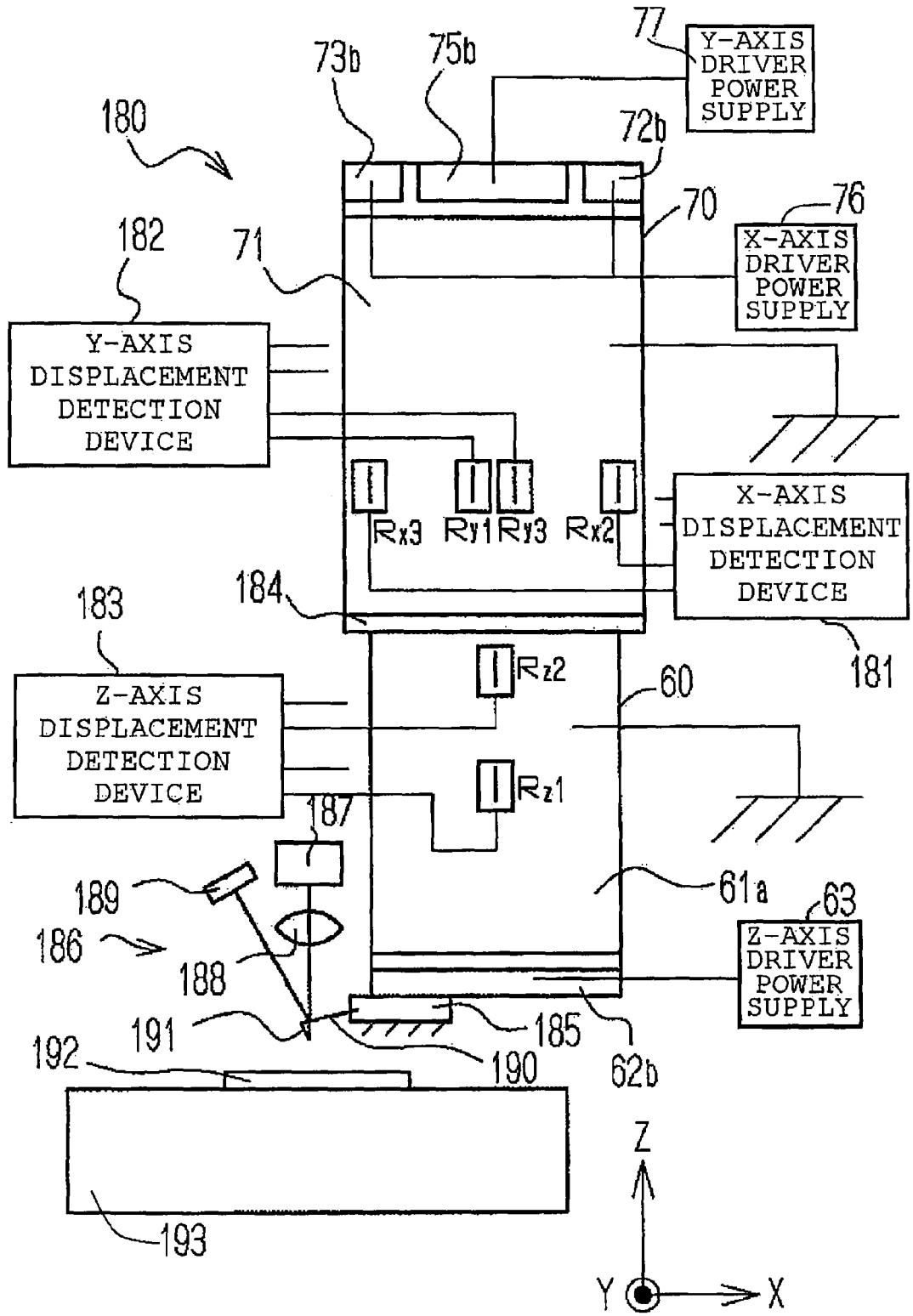
FIG. 21 is a schematic external view illustrating a scanning probe microscope using a cylindrical piezoelectric actuator provided with a displacement meter according to Embodiment 12 of the present invention.
Figure 22:
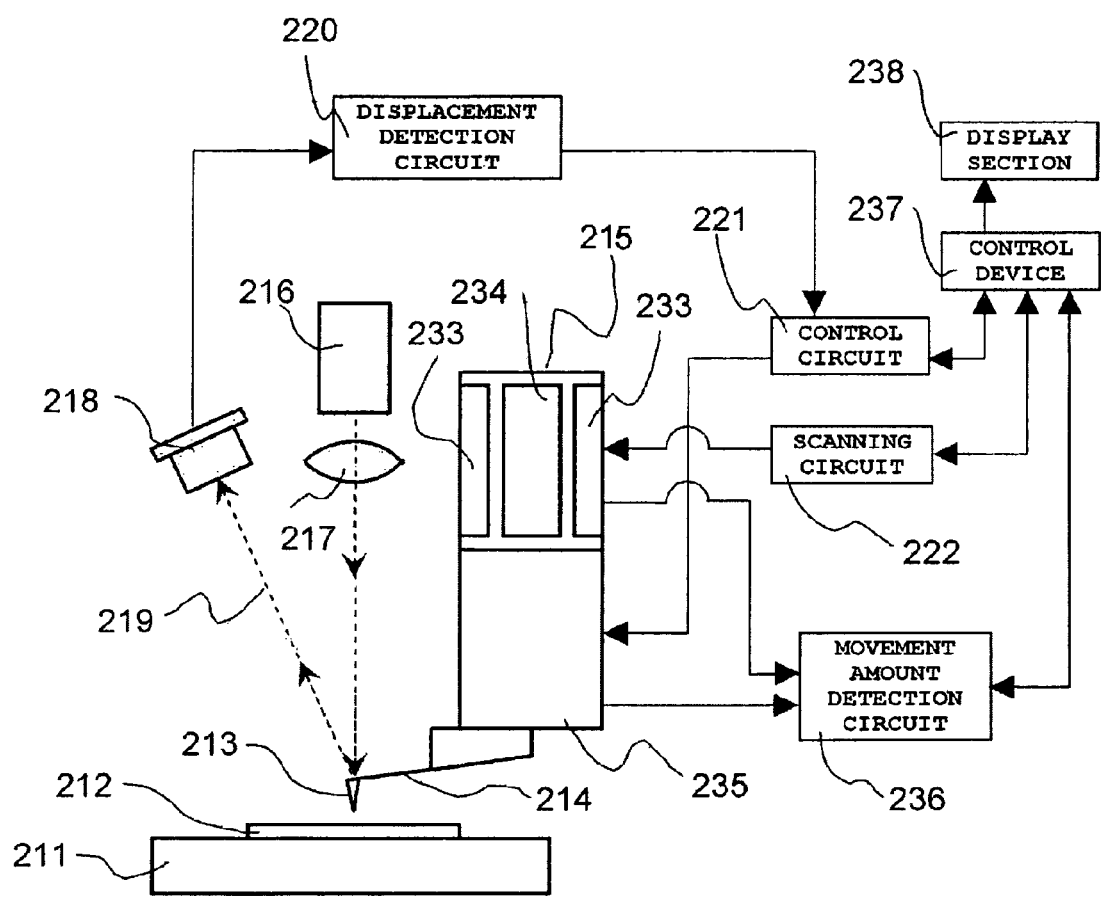
FIG. 22 is a schematic external view illustrating a scanning probe microscope using a conventional cylindrical piezoelectric actuator provided with a displacement meter.
Figure 23:
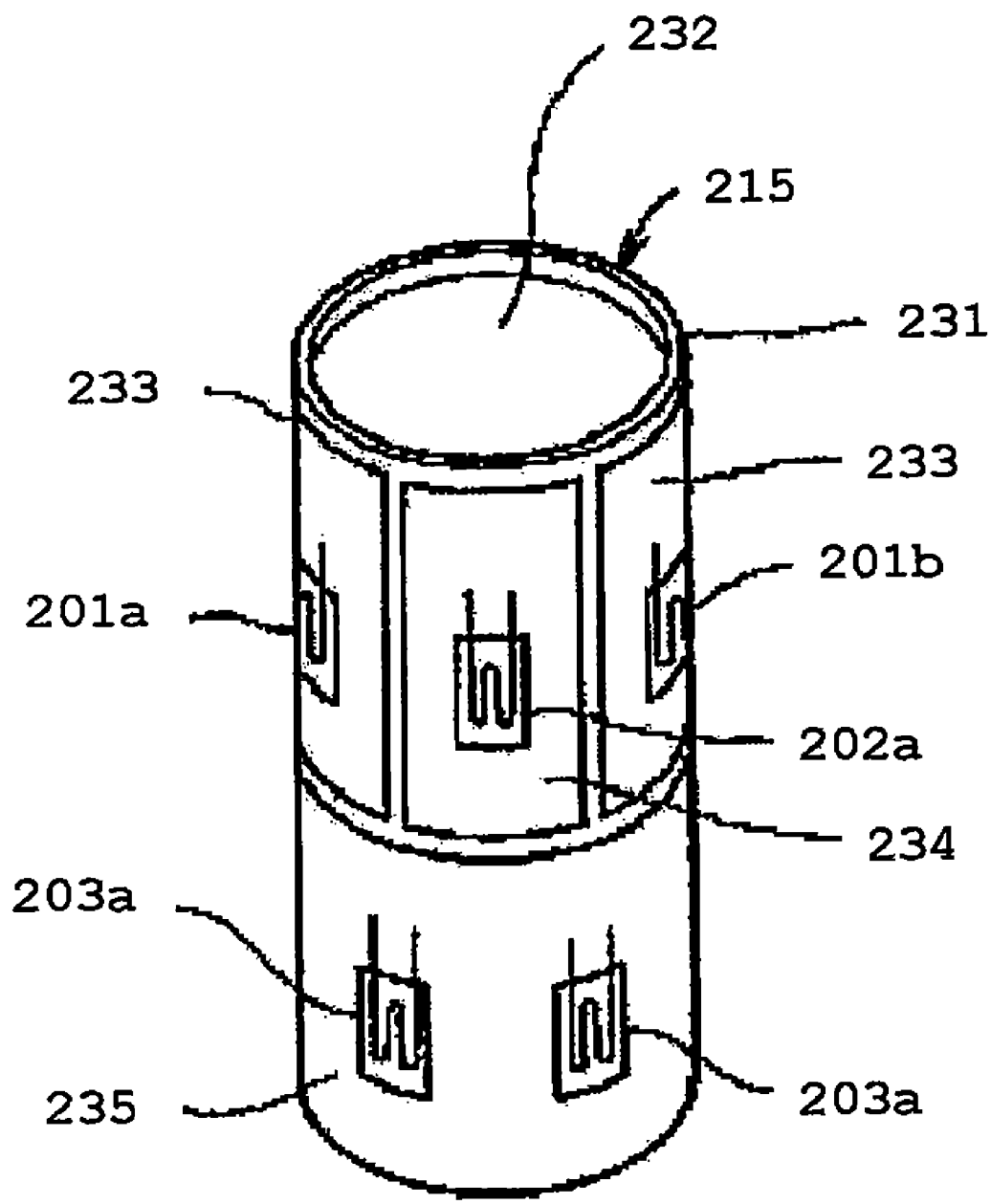
FIG. 23 is a schematic external view illustrating the cylindrical piezoelectric actuator provided with a displacement meter which is used in the scanning probe microscope of FIG. 22.
Figure 24:
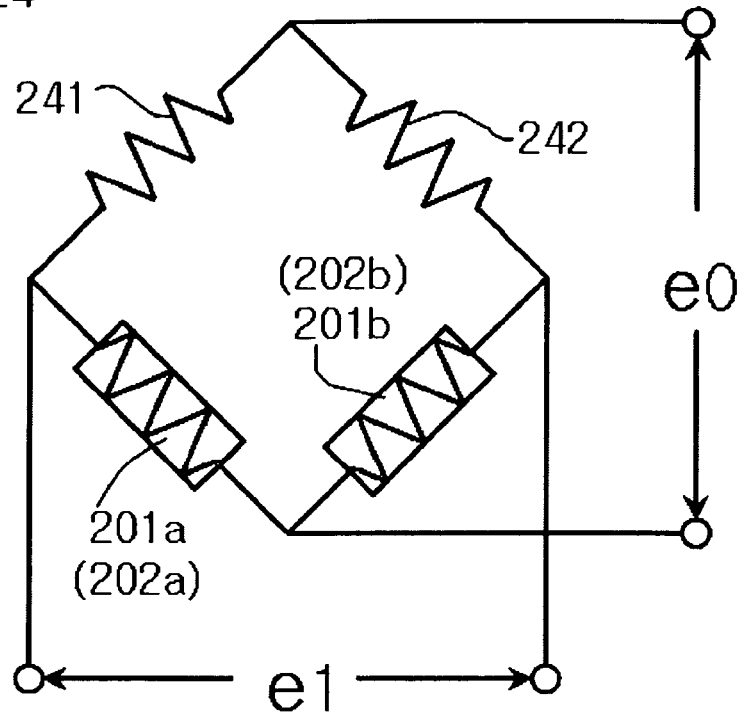
FIG. 24 is a circuit diagram used to detect a lateral displacement by the cylindrical piezoelectric actuator provided with a displacement meter of FIG. 23.
Figure 25:
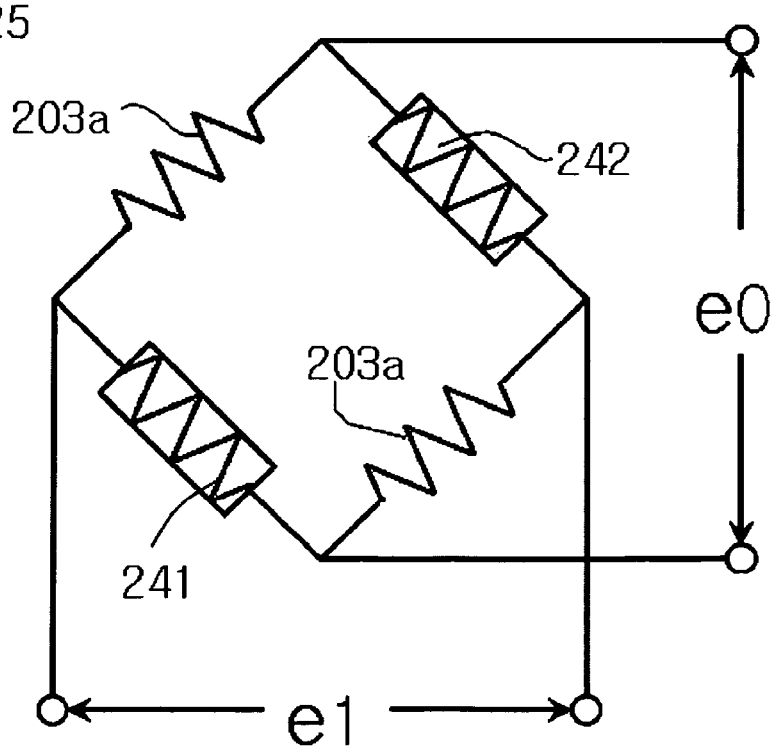
FIG. 25 is a circuit diagram used to detect a longitudinal displacement by the cylindrical piezoelectric actuator provided with a displacement meter of FIG. 23.

FIG. 21 illustrates a structural example of a scanning probe microscope 180 using a combination of the cylindrical piezoelectric actuator according to Embodiment 3 and the cylindrical piezoelectric actuator according to Embodiment 4, which is an example of a positioning device using a piezoelectric actuator provided with a displacement meter.

In this embodiment, the terminal end portion of the piezoelectric actuator for lateral driving as illustrated in FIGS. 11A and 11B is fixed to a base (not shown). The piezoelectric actuator for vertical driving as illustrated in FIGS. 10A and 10B is fixed to the tip end portion of the piezoelectric element 70 through intermediation of a fixing member 184. A cantilever holder 185 is provided at the tip end portion of the piezoelectric actuator for vertical driving. A cantilever 190 which has a probe 191 provided at the tip end is held by the cantilever holder 185. In this manner, the two piezoelectric actuators (elements 60 and 70) are used for a triaxial fine adjustment mechanism.

A sample holder 193 is opposed to the probe 191, and a sample 192 is placed thereon.

A displacement of the cantilever 190 is measured by an optical lever type displacement detection mechanism 186 including a semiconductor laser 187, a condenser lens 188, and a photo detector 189.

Although the sample 171 is scanned in Embodiment 11, the cantilever 190 is scanned in this embodiment. The other operation in this embodiment is identical to that in Embodiment 11, and hence the description thereof is omitted.

When the split electrodes are to be manufactured on the inner surface of the cylindrical piezoelectric element, a sophisticated electrode division technique is required as compared with the case where the split electrodes are manufactured on the outer surface. However, when the piezoelectric actuator 60 for vertical driving and the piezoelectric actuator 70 for lateral driving are separated from each other as in this embodiment, the number of split regions of the inner electrodes of each of the piezoelectric actuators 60 and 70 becomes smaller, with the result that manufacturing can be easily performed.

When the electrode portions 71 and 61a located on the outer surface of the cylindrical piezoelectric actuator are connected with ground as in Embodiments 11 and 12, the mixing of noise into not only the detection signal of the strain gauge but also wiring materials or electrical parts which are provided around the cylindrical piezoelectric element is reduced. As a result, a noise level of measurement data becomes smaller. In particular, this is effective in a case where electrical characteristics of a sample surface is measured by a scanning probe microscope.

In addition to the case of the wiring material of the strain gauge, other wiring materials and electrical parts which are provided around the piezoelectric actuator are prevented from being short-circuited with the electrode portions of the piezoelectric actuator.

The present invention is not limited to the embodiments as described above.

A piezoelectric element having an arbitrary shape can be used. The electrode on the piezoelectric element can be made of a conductive material such as copper, silver, or gold in addition to nickel. A structure in which an electrode is coated with an insulator at the manufacturing stage of a piezoelectric element and a resistor bonded to a base made of an insulator is attached onto the electrode coated with the insulator is substantially identical to that in the present invention. Therefore, such a structure is also encompassed by the present invention.

The resistor is made of an arbitrary material. In addition to the n-type semiconductor and the copper-nickel alloy as described in the embodiments, for example, a nichrome-based alloy, a p-type semiconductor, a combination of the n-type semiconductor and the p-type semiconductor can be used. The shape of the resistor is not limited to the linear shape and thus an arbitrary shape can be used.

In addition to the polyimide resin and the phenol/epoxy-mixed resin, an arbitrary insulating material such as paper, a phenol resin, or an epoxy resin can be used for the base material which is made of the insulator and provided with the resistor. The base material fixing method is not necessarily limited to bonding. Evaporation of $SiO_2$ or the like may be performed. Alternatively, the resistor may be directly provided on a base material which is an insulating adhesive. The positioning device using the piezoelectric actuator provided with a displacement meter according to the present invention can be applied to various apparatuses such as, for example, an optical microscope, a laser microscope, a semiconductor manufacturing apparatus, a semiconductor testing apparatus, a working machine, OA equipment, AV equipment, and optical equipment, in addition to the scanning probe microscope.

What is claimed is:

1. A piezoelectric actuator provided with a displacement meter, comprising:

a piezoelectric element which is formed into an arbitrary shape, has an internal crystal polarized in an arbitrary direction, and includes electrodes provided on at least two surfaces opposed in a thickness direction thereof;

a driver power supply for applying a voltage between the electrodes to generate strain in the piezoelectric element;

resistors provided on the electrodes through intermediation of insulators; and a displacement detection device connected with the resistors, for detecting a change in resistance value when an arbitrary voltage is applied between the resistors, to detect an amount of strain of the piezoelectric element, wherein the electrodes of the piezoelectric element, on which the resistors are provided, are set at one of a ground potential or a potential equal to the voltage applied between the resistors and are configured to generate strain when a voltage is applied between the electrodes.

2. A piezoelectric actuator provided with a displacement meter according to claim 1, wherein:

the piezoelectric element comprises a stacked piezoelectric element having a plurality of film-shaped piezoelectric elements and a plurality of electrodes alternately stacked;

the electrodes are alternately connected with the plurality of electrodes each sandwiched by two of the plurality of film-shaped piezoelectric elements and formed as side surface electrodes of the stacked piezoelectric element; and one of the side surface electrodes includes a resistor provided through intermediation of an insulator.

3. A piezoelectric actuator provided with a displacement meter according to claim 1, wherein each of the resistors comprises a semiconductor.

4. A piezoelectric element used for the piezoelectric actuator provided with a displacement meter according to claim 1.

5. A positioning device using the piezoelectric actuator provided with a displacement meter according to claim 1.

6. A piezoelectric actuator provided with a displacement meter, comprising:
   a cylindrical piezoelectric element which is a cylinder having an inner surface and an outer surface, has an internal crystal polarized in an arbitrary direction, and includes an electrode provided on the inner surface of the cylinder and an electrode provided on the outer surface thereof;
   a driver power supply for applying a voltage between the electrodes to generate strain in the piezoelectric element;
   a resistor provided on the electrode provided on the outer surface through intermediation of an insulator; and
   a displacement detection device connected with the resistor, for detecting a change in resistance value when an arbitrary voltage is applied to the resistor, to detect an amount of strain of the piezoelectric element,
   wherein the electrodes of the piezoelectric element, on which the resistor is provided, is set at one of a ground potential or a potential equal to the voltage applied to the resistor and are configured to generate strain when a voltage is applied between the electrodes.

7. A piezoelectric actuator provided with a displacement meter according to claim 6, wherein the electrode provided on the inner surface is divided into a plurality of parts.

8. A piezoelectric actuator provided with a displacement meter according to claim 6, wherein:
   the electrode provided on the outer surface comprises one of a single band-shaped electrode provided along a circumference and a combination of a single band-shaped electrode and a folded electrode connected with the electrode provided on the inner surface; and
   the band-shaped electrode includes a resistor provided through intermediation of an insulator.

9. A piezoelectric actuator provided with a displacement meter according to claim 6, wherein:
   the piezoelectric element further comprises:
   at least two electrodes provided on the inner surface;
   a piezoelectric material; and
   an electrode which is opposed to the each of the at least two electrodes provided on the inner surface and provided on the outer surface;
   at least one of the at least two electrodes provided on the inner surface comprises a dummy electrode which causes no strain;
   each of remaining electrodes of the at least two electrodes provided on the inner surface comprises an active electrode which strains the piezoelectric element when the voltage is applied;
   at least one resistor is provided on an outer surface side of the active electrode;
   at least one resistor is provided on an outer surface side of the dummy electrode;
   the electrodes on which the resistors are provided are set to be equal in potential to each other and connected with ground; and
   when strain is to be detected by the resistor provided on the outer surface side of the active electrode, the resistors provided between the active electrode and the dummy electrode are connected to serve as a bridge circuit so that temperature compensation is performed by the resistor provided on the outer surface side of the dummy electrode.

10. A piezoelectric actuator provided with a displacement meter according to claim 9, wherein the piezoelectric element including the dummy electrode and the piezoelectric element including the active electrode are formed with an identical piezoelectric material and separated from each other.

11. A piezoelectric actuator provided with a displacement meter according to claim 6, wherein at least one of the electrodes provided on the inner surface and the electrode provided on the outer surface is produced by a method of forming an electrode on a surface of a piezoelectric material, and then removing a part of the electrode by mechanical processing.

12. A piezoelectric actuator provided with a displacement meter according to claim 6, wherein at least one of the electrodes provided on the inner surface and the electrode provided on the outer surface is produced by a method of forming a mask on a region of a surface of a piezoelectric material, forming an electrode on a region other than the region on which the mask is formed, and then removing the mask.

13. A piezoelectric actuator provided with a displacement meter according to claim 6, wherein each of the resistors comprises a semiconductor.

14. A piezoelectric element used for the piezoelectric actuator provided with a displacement meter according to claim 6.

15. A positioning device using the piezoelectric actuator provided with a displacement meter according to claim 6.

16. A piezoelectric actuator provided with a displacement meter, comprising:
   a piezoelectric element which is formed into an arbitrary shape, has an internal crystal polarized in an arbitrary direction, and includes electrodes provided on a least two surfaces opposed in a thickness direction thereof;
   a driver power supply for applying a voltage between the electrodes to generate strain in the piezoelectric element;
   resistors provided on the electrodes of the piezoelectric element through intermediation of insulators; and
   a displacement detection device connected with the resistors, for detecting a change in resistance value when an arbitrary voltage is applied between the resistors to detect an amount of strain of the piezoelectric element,
   wherein electrodes are absent in regions of the piezoelectric element, in which the resistors are provided.

17. A piezoelectric actuator provided with a displacement meter according to claim 16, wherein each of the resistors comprises a semiconductor.

18. A piezoelectric element used for the piezoelectric actuator provided with a displacement meter according to claim 16.

19. A positioning device using the piezoelectric actuator provided with a displacement meter according to claim 16.

* * * * *